US009612725B1

(12) United States Patent
Senesac

(10) Patent No.: US 9,612,725 B1
(45) Date of Patent: Apr. 4, 2017

(54) NONCONFORMANCE VISUALIZATION SYSTEM

(71) Applicant: The Boeing Company, Chicago, IL (US)

(72) Inventor: Christopher J. Senesac, Daniel Island, SC (US)

(73) Assignee: THE BOEING COMPANY, Chicago, IL (US)

( * ) Notice: Subject to any disclaimer, the term of this patent is extended or adjusted under 35 U.S.C. 154(b) by 334 days.

(21) Appl. No.: 13/798,964

(22) Filed: Mar. 13, 2013

(51) Int. Cl.
G06F 3/0484 (2013.01)
G06F 17/50 (2006.01)

(52) U.S. Cl.
CPC ........ *G06F 3/0484* (2013.01); *G06F 17/5095* (2013.01)

(58) Field of Classification Search
CPC .................................................. G06F 17/5095
See application file for complete search history.

(56) References Cited

U.S. PATENT DOCUMENTS

| 3,744,917 | A | 7/1973 | Craig |
| 4,815,190 | A | 3/1989 | Haba et al. |
| 4,894,908 | A | 1/1990 | Haba et al. |
| 5,023,805 | A | 6/1991 | Aune |
| 5,367,552 | A | 11/1994 | Peschmann |
| 5,544,558 | A | 8/1996 | Hughes |
| 5,771,043 | A | 6/1998 | Nigawara et al. |
| 5,822,218 | A | 10/1998 | Moosa et al. |
| 5,960,104 | A | 9/1999 | Conners |
| 6,000,610 | A | 12/1999 | Talbott et al. |
| 6,167,394 | A | 12/2000 | Leung et al. |
| 6,240,328 | B1 | 5/2001 | LaLonde et al. |
| 6,345,207 | B1 | 2/2002 | Nitta et al. |
| 6,378,387 | B1 | 4/2002 | Froom |

(Continued)

FOREIGN PATENT DOCUMENTS

| EP | 1321869 A2 | 6/2003 |
| EP | 2431915 A2 | 3/2012 |

(Continued)

OTHER PUBLICATIONS

Marianna Airmotive Uses a FARO Laser Tracker to Reduce Repair Turnaround Time dramatically, mariannaautomotive.com Mar. 7, 2012.*

(Continued)

*Primary Examiner* — William Bayshore
*Assistant Examiner* — Nathan Shrewsbury
(74) *Attorney, Agent, or Firm* — Yee & Associates, P.C.

(57) ABSTRACT

A method and apparatus for recording a nonconformance in an aircraft. A model is identified for the aircraft. Sections of the aircraft are displayed in a graphical user interface on a display device. The sections correspond to sections as manufactured for assembly of the aircraft. The sections are selectable. Graphical representations of parts are displayed in a volume in the model in the graphical user interface on a display device from a selection of a section in the sections. The volume corresponds to a location of the nonconformance in the aircraft. The nonconformance for a part is identified from a selection of a graphical representation of the part from the graphical representations of the parts. The nonconformance that was identified is recorded.

18 Claims, 18 Drawing Sheets

(56) References Cited

U.S. PATENT DOCUMENTS

| | | | |
|---|---|---|---|
| 6,381,509 B1 | 4/2002 | Thiel et al. | |
| 6,418,189 B1 | 7/2002 | Schafer | |
| 6,477,471 B1 | 11/2002 | Hedstrom et al. | |
| 6,481,096 B2 | 11/2002 | Lehmker | |
| 6,487,479 B1 | 11/2002 | Nelson | |
| 6,597,761 B1 | 7/2003 | Garms, III | |
| 6,604,681 B1 | 8/2003 | Burke | |
| 6,637,266 B1 | 10/2003 | Froom | |
| 6,912,507 B1 | 6/2005 | Phillips | |
| 6,941,204 B2 | 9/2005 | Halm | |
| 7,042,346 B2 | 5/2006 | Paulsen | |
| 7,050,894 B2 | 5/2006 | Halm et al. | |
| 7,103,434 B2 | 9/2006 | Chernyak | |
| 7,167,583 B1 | 1/2007 | Lipson et al. | |
| 7,302,443 B2 | 11/2007 | Nakajima et al. | |
| 7,333,991 B2 | 2/2008 | Hill et al. | |
| 7,343,213 B1 | 3/2008 | Burgess | |
| 7,353,192 B1 | 4/2008 | Ellis et al. | |
| 7,365,747 B2 | 4/2008 | Finlayson et al. | |
| 7,366,688 B2 | 4/2008 | Kwasniewski et al. | |
| 7,646,384 B2 | 1/2010 | Anderson et al. | |
| 7,650,202 B2 | 1/2010 | Strohband et al. | |
| 7,933,441 B2 | 4/2011 | Numata | |
| 7,954,070 B2 | 5/2011 | Plocher | |
| 8,027,745 B1 | 9/2011 | Freeze | |
| 8,051,547 B2 | 11/2011 | Toh | |
| 8,079,130 B2 | 12/2011 | Hardouin-Finez | |
| 8,116,529 B2 | 2/2012 | Edwards | |
| 8,352,904 B2 | 1/2013 | Hodges | |
| 8,482,412 B2 | 7/2013 | Majoros et al. | |
| 8,527,348 B2 | 9/2013 | Petrov | |
| 8,571,951 B2 | 10/2013 | Diana et al. | |
| 8,606,540 B2 | 12/2013 | Haisty et al. | |
| 8,610,761 B2 | 12/2013 | Haisty et al. | |
| 8,620,627 B2 | 12/2013 | Nakhle et al. | |
| 8,791,823 B2 | 7/2014 | Xu | |
| 8,849,636 B2 | 9/2014 | Becker | |
| 8,860,760 B2 | 10/2014 | Chen | |
| 8,914,149 B2 | 12/2014 | Safa-Bakhsh et al. | |
| 2002/0007225 A1 | 1/2002 | Costello et al. | |
| 2002/0026296 A1* | 2/2002 | Lohmann | G05B 19/409 703/1 |
| 2002/0071524 A1 | 6/2002 | Renkart | |
| 2002/0168083 A1 | 11/2002 | Garms | |
| 2002/0198764 A1 | 12/2002 | Schorno | |
| 2003/0055619 A1* | 3/2003 | Singarajan | G06F 17/5095 703/8 |
| 2003/0055812 A1 | 3/2003 | Williams et al. | |
| 2003/0083794 A1 | 5/2003 | Halm | |
| 2003/0120472 A1 | 6/2003 | Lind | |
| 2003/0149500 A1* | 8/2003 | Faruque | G06F 17/5018 700/97 |
| 2003/0158702 A1 | 8/2003 | Busche et al. | |
| 2004/0068350 A1 | 4/2004 | Tomson | |
| 2004/0093100 A1 | 5/2004 | Gleis | |
| 2004/0098151 A1 | 5/2004 | Carlucci et al. | |
| 2004/0128117 A1* | 7/2004 | Crandall | G06F 17/5009 703/2 |
| 2004/0162651 A1 | 8/2004 | Halm | |
| 2005/0044011 A1 | 2/2005 | Deal | |
| 2005/0149216 A1 | 7/2005 | Popplewell | |
| 2005/0228708 A1 | 10/2005 | Catala et al. | |
| 2005/0278062 A1 | 12/2005 | Janert et al. | |
| 2006/0106682 A1 | 5/2006 | Van Dyck et al. | |
| 2006/0119601 A1 | 6/2006 | Finlayson et al. | |
| 2007/0013709 A1 | 1/2007 | Charles et al. | |
| 2007/0106410 A1 | 5/2007 | Bouffiou et al. | |
| 2007/0106414 A1 | 5/2007 | Strohband et al. | |
| 2007/0219645 A1 | 9/2007 | Thomas et al. | |
| 2008/0052046 A1 | 2/2008 | Botvinnik | |
| 2008/0140270 A1 | 6/2008 | Davis et al. | |
| 2008/0187897 A1 | 8/2008 | Franzen et al. | |
| 2008/0205763 A1 | 8/2008 | Marsh et al. | |
| 2008/0209342 A1 | 8/2008 | Taylor | |
| 2008/0234850 A1 | 9/2008 | Bowling et al. | |
| 2008/0252311 A1 | 10/2008 | Koh et al. | |
| 2008/0294395 A1 | 11/2008 | Lu | |
| 2008/0301012 A1 | 12/2008 | Cogswell et al. | |
| 2009/0013281 A1 | 1/2009 | Helfman et al. | |
| 2009/0112349 A1* | 4/2009 | Cobb | B64F 5/0009 700/114 |
| 2009/0138230 A1 | 5/2009 | Davies et al. | |
| 2009/0144962 A1 | 6/2009 | Hardouin-Finez | |
| 2009/0192644 A1 | 7/2009 | Meyer et al. | |
| 2009/0228133 A1 | 9/2009 | Loda | |
| 2009/0248545 A1 | 10/2009 | Robinson et al. | |
| 2009/0312897 A1 | 12/2009 | Jamrosz et al. | |
| 2010/0010794 A1* | 1/2010 | Sweers | 703/8 |
| 2010/0042952 A1 | 2/2010 | Geesey | |
| 2010/0097195 A1 | 4/2010 | Majoros et al. | |
| 2010/0125468 A1* | 5/2010 | Avery et al. | 705/7 |
| 2010/0161095 A1 | 6/2010 | Lindgren | |
| 2010/0175013 A1 | 7/2010 | Krauter et al. | |
| 2010/0299304 A1 | 11/2010 | Vasudevan | |
| 2011/0022208 A1 | 1/2011 | Bouffiou et al. | |
| 2011/0041088 A1 | 2/2011 | Mason et al. | |
| 2011/0046763 A1* | 2/2011 | Tsuchiya et al. | 700/98 |
| 2011/0087466 A1* | 4/2011 | Vossmann | 703/1 |
| 2011/0087513 A1* | 4/2011 | Floyd et al. | 705/7.23 |
| 2011/0125303 A1 | 5/2011 | Rollmann et al. | |
| 2011/0137443 A1* | 6/2011 | Farahani | 700/98 |
| 2011/0166824 A1 | 7/2011 | Haisty et al. | |
| 2011/0169924 A1 | 7/2011 | Haisty et al. | |
| 2011/0172795 A1 | 7/2011 | Hansen et al. | |
| 2011/0251711 A1 | 10/2011 | Goel | |
| 2011/0288840 A1* | 11/2011 | Kropinski et al. | 703/8 |
| 2012/0007852 A1 | 1/2012 | Morate et al. | |
| 2012/0030926 A1 | 2/2012 | Toh et al. | |
| 2012/0050522 A1 | 3/2012 | Slyck et al. | |
| 2012/0062725 A1 | 3/2012 | Wampler, II et al. | |
| 2012/0071998 A1 | 3/2012 | Davies et al. | |
| 2012/0075343 A1 | 3/2012 | Chen et al. | |
| 2012/0100520 A1 | 4/2012 | Jo et al. | |
| 2012/0130521 A1 | 5/2012 | Kohlhoff | |
| 2012/0140041 A1 | 6/2012 | Burgunder et al. | |
| 2012/0249588 A1 | 10/2012 | Tison et al. | |
| 2012/0303336 A1 | 11/2012 | Becker et al. | |
| 2012/0304059 A1 | 11/2012 | McCloskey | |
| 2012/0306666 A1 | 12/2012 | Xu et al. | |
| 2013/0006409 A1 | 1/2013 | Evans et al. | |
| 2013/0036031 A1 | 2/2013 | Hutchinson et al. | |
| 2013/0124150 A1* | 5/2013 | Kim et al. | 703/1 |
| 2013/0132373 A1 | 5/2013 | Huang et al. | |
| 2013/0239330 A1 | 9/2013 | Newlin et al. | |
| 2013/0261876 A1 | 10/2013 | Froom | |
| 2013/0297633 A1* | 11/2013 | Edwards | G06F 17/50 707/758 |
| 2014/0013263 A1 | 1/2014 | Bailiang | |
| 2014/0089030 A1 | 3/2014 | Bell | |
| 2015/0134274 A1 | 5/2015 | Froom | |

FOREIGN PATENT DOCUMENTS

| | | |
|---|---|---|
| EP | 2458562 A1 | 5/2012 |
| EP | 2790136 A1 | 10/2014 |
| GB | 2327289 A | 1/1999 |
| JP | 2007095039 A | 4/2007 |
| WO | WO0049544 A2 | 8/2000 |
| WO | WO2008144797 A1 | 12/2008 |
| WO | WO2011056196 A1 | 5/2011 |
| WO | WO2012166545 A2 | 12/2012 |
| WO | WO2013078156 A1 | 5/2013 |
| WO | WO2013078265 A1 | 5/2013 |

OTHER PUBLICATIONS

What's New in SolidWorks Version 2010.*

International Search Report and Written Opinion, dated Apr. 25, 2014, regarding Application No. PCT/US2014/010912, 10 pages.

Extended European Search Report, dated Jun. 2, 2014, regarding Application No. 14160787.9, 6 pages.

(56) References Cited

OTHER PUBLICATIONS

"Notice from the European Patent Office dated Oct. 1, 2007 concerning business methods," Official Journal EPO, Nov. 2007, pp. 592-593.
Extended European Search Report, dated Sep. 30, 2014, regarding Application No. EP14159760.9, 6 pages.
International Search Report and Written Opinion, dated Nov. 19, 2014, regarding Application No. PCT/US2014/011196, 10 pages.
International Search Report and Written Opinion, dated Dec. 1, 2014, regarding Application No. PCT/US2014/031030, 9 pages.
Extended European Search Report, dated Dec. 3, 2014, regarding Application No. 14170988.1, 7 pages.
Office Action, dated Dec. 17, 2014, regarding U.S. Appl. No. 13/780,109, 37 pages.
Gass et al., "Locator System for Three-Dimensional Visualization," U.S. Appl. No. 13/855,102, filed Apr. 2113, 87 pages.
Senesac et al., "Condition of Assembly Visualization System Based on Build Cycles," U.S. Appl. No. 13/835,262, filed Mar. 15, 2013, 79 pages.
Senesac et al., "Shop Order Status Visualization System," U.S. Appl. No. 13/785,616, filed Mar. 15, 2013, 98 pages.
Senesac, "Condition of Assembly Visualization System," U.S. Appl. No. 13/834,893, filed Mar. 15, 2013, 73 pages.
Senesac, "Object Visualization System," U.S. Appl. No. 13/780,109, filed Feb. 28, 2013, 61 pages.
Senesac, "Shop Order Status Visualization System," U.S. Appl. No. 13/858,364, filed Apr. 18, 2013, 108 pages.
Senesac et al., "Aircraft Comparison System," U.S. Appl. No. 13/860,126, filed Apr. 10, 2013, 103 pages.
Senesac et al., "Nonconformance Visualization System," U.S. Appl. No. 13/861,678, filed Apr. 12, 2013, 116 pages.
Senesac, "Shop Order Status Visualization System," U.S. Appl. No. 13/890,347, filed May 9, 2013, 96 pages.
Prazak et al., "Visualization of an Object Using a Visual Query System," U.S. Appl. No. 13/852,063, filed Mar. 28, 2013, 50 pages.
Senesac et al., "Aircraft Comparison System with Synchronized Displays," U.S. Appl. No. 13/922,411, filed Jun. 20, 2013, 120 pages.
Senesac, "Serial Number Control Visualization System," U.S. Appl. No. 14/467,706, filed Aug. 25, 2014, 113.
Extended European Search Report, dated Jul. 17, 2014, regarding Application No. 14162481.7, 5 pages.
Extended European Search Report, dated Jul. 23, 2014, regarding Application No. 14157597.7, 7 pages.
Extended European Search Report, dated Aug. 22, 2014, regarding Application No. EP14159832.6, 9 pages.
Australian Government Patent Examination Report No. 2, dated Jul. 8, 2015, regarding Application No. 2014200514, 3 pages.
Australian Government Patent Examination Report No. 3, dated Aug. 13, 2015, regarding Application No. 2014200514, 4 pages.
Australian Government Patent Examination Report No. 2, dated Jul. 30, 2015, regarding Application No. 2014200292, 5 pages.
International Preliminary Report on Patentability, dated Sep. 1, 2015, regarding Application No. PCT/US2014/010912, 6 pages.
Australian Government Patent Examination Report No. 1, dated Mar. 18, 2015, regarding Application No. 2014200514, 4 pages.
Canadian Intellectual Property Office Examination Search Report, dated Mar. 24, 2015, regarding Application No. 2,840,798, 6 pages.
Australian Government Patent Examination Report No. 1, dated Mar. 27, 2015, regarding Application No. 2014200292, 3 pages.
Canadian Intellectual Property Office Examination Search Report, dated Apr. 15, 2015, regarding Application No. 2,839,913, 4 pages.
Office Action, dated Sep. 17, 2015, regarding U.S. Appl. No. 13/780,109, 47 pages.
Office Action, dated Jul. 24 2015, regarding U.S. Appl. No. 13/785,616, 55 pages.
Office Action, dated Sep. 21, 2015, regarding U.S. Appl. No. 13/835,262, 41 pages.
Office Action, dated Aug. 14, 2015, regarding U.S. Appl. No. 13/890,347, 44 pages.
Final Office Action, dated Sep. 4, 2015, regarding U.S. Appl. No. 13/861,678, 27 pages.
Office Action, dated Sep. 29 2015, regarding U.S. Appl. No. 13/860,126, 34 pages.
Final Office Action, dated Jul. 31 2015, regarding U.S. Appl. No. 13/922,411, 23 pages.
Final Office Action, dated Oct. 22, 2015, regarding U.S. Appl. No. 13/852,063, 30 pages.
Notice of Allowance, dated Jun. 22, 2015, regarding U.S. Appl. No. 13/834,893, 24 pages.
Final Office Action, dated Jun. 26, 2015, regarding U.S. Appl. No. 13/855,102, 18 pages.
Office Action, dated Jun. 29, 2015, regarding U.S. Appl. No. 13/922,411, 43 pages.
Final Office Action, dated Mar. 27, 2015, regarding U.S. Appl. No. 13/780,109, 18 pages.
Non-Patent Literature including images from the website www.aso.com, as published on Jan. 16, 2013 based on captures in the Internet Archive tool referred to as the WayBackMachine, http://web.archive.org/web/20130116040904/ http://www.aso.com/ ("NPL1"), in Final Office Action dated Mar. 27, 2015, 3 pages.
Office Action, dated May 6, 2015, regarding U.S. Appl. No. 13/852,063, 39 pages.
Office Action, dated May 5, 2015, regarding U.S. Appl. No. 13/861,678, 48 pages.
Office Action, dated Feb. 26, 2015, regarding U.S. Appl. No. 13/858,364, 32 pages.
Notice of Allowance, dated Apr. 13, 2015, regarding U.S. Appl. No. 13/858,364, 5 pages.
Office Action, dated Feb. 27, 2015, regarding U.S. Appl. No. 13/834,893, 41 pages.
Office Action, dated Mar. 4, 2015, regarding U.S. Appl. No. 13/855,102, 28 pages.
Final Office Action, dated Dec. 2, 2015, regarding U.S. Appl. No. 13/785,616, 38 pages.
Roh et al., "An object-based 3D walk-through model for interior construction progress monitoring", May 3, 2010, Elsevier, Automation in construction 20, pp. 66-75.
Prazak et al., "Visualization of an Object Using a Visual Query System," U.S. Appl. No. 15/003,802, filed Jan. 22, 2016, 49 pages.
Extended European Search Report, dated Jun. 17, 2016, regarding Application No. EP15176304.2, 9 pages.
Notice of Allowance, dated Nov. 6, 2015, regarding U.S. Appl. No. 13/855,102, 20 pages.
Final Office Action, dated Nov. 20, 2015, regarding U.S. Appl. No. 13/890,347, 38 pages.
Final Office Action, dated May 6, 2016, regarding U.S. Appl. No. 13/861,678, 33 pages.
Final Office Action, dated Feb. 9, 2016, regarding U.S. Appl. No. 13/835,262, 32 pages.
Office Action, dated Mar. 28, 2016, regarding U.S. Appl. No. 13/835,262, 21 pages.
European Patent Office Communication, dated Jan. 26, 2016, regarding Application No. 14159760.9, 5 pages.
Notices of Reasons for Rejection and English Translation, issued Jan. 29, 2016, regarding Japanese Patent Application No. 2014-060864, 7 pages.
Australian Government Patent Examination Report No. 2, dated Oct. 29, 2015, regarding Application No. 2014200304, 4 pages.
Canadian Intellectual Property Office Examination Search Report, dated Oct. 28, 2015, regarding Application No. 2,839,914, 5 pages.
Australian Government Patent Examination Report No. 1, dated May 13, 2015, regarding Application No. 2014200304, 4 pages.
Canadian Intellectual Property Office Examination Search Report, dated Feb. 17, 2015, regarding Application No. 2,839,914, 6 pages.
European Patent Office Communcation, dated Sep. 15, 2015, regarding Application No. 14157597.7, 7 pages.
Notices of Reasons for Rejection and English Translation, issued Sep. 8, 2015, regarding Japanese Patent Application No. 2014-060864, 5 pages.
Kokogawa et al., "Wide-Area Contents Distribution based on Cooperation among Digital Libraries," Information Processing Academic Society Research Report, Mar. 10, 2000, vol. 2000, No. 26, pp. 83-88.
Extended European Search Report, dated Nov. 18, 2015, regarding Application No. EP14159752.6, 6 pages.
Office Action, dated Jul. 27 2016, regarding U.S. Appl. No. 13/785,616 , 59 pages.
Notice of Allowance, dated Jun. 24, 2016, regarding U.S. Appl. No. 13/835,262 , 19 pages.

(56) References Cited

OTHER PUBLICATIONS

Office Action, dated Jul. 8, 2016 regarding U.S. Appl. No. 14/467,706, 94 pages.
Office Action, dated Jan. 15, 2015, regarding U.S. Appl. No. 13/861,678, 37 pages.
Slack et al., "Non-Conformance Mapping and Visualization," U.S. Appl. No. 15/056,536, filed Feb. 29, 2016, 43 pages.
Final Office Action, dated Jan. 25, 2016, regarding U.S. Appl. No. 13/780,109, 54 pages.
Canadian Intellectual Property Office Examination Search Report, dated Aug. 28, 2016, regarding Application No. 2,839,914, 6 pages.
Japanese Preliminary Examination Report, dated Aug. 5, 2016, regarding Application No. 2014-060864, 9 pages.
European Patent Office Examination Report, dated Oct. 14, 2016 regarding Application No. 14160787.9, 6 pages.
Office Action, dated Oct. 3, 2016, regarding U.S. Appl. No. 13/890,347, 60 pages.
Final Office Action, dated Oct. 20, 2016, regarding U.S. Appl. No. 13/785,616, 43 pages.
Final Office Action, dated Oct. 13, 2016, regarding U.S. Appl. No. 14/467,706, 28 pages.
Office Action, dated Dec. 14, 2016, regarding U.S. Appl. No. 13/861,678, 29 pages.

\* cited by examiner

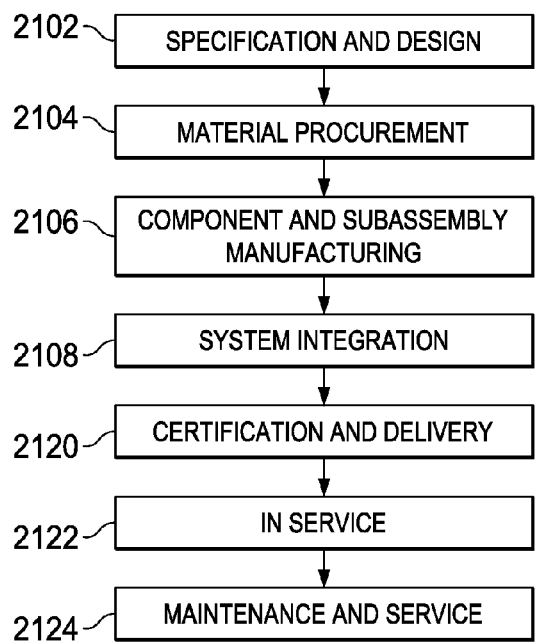
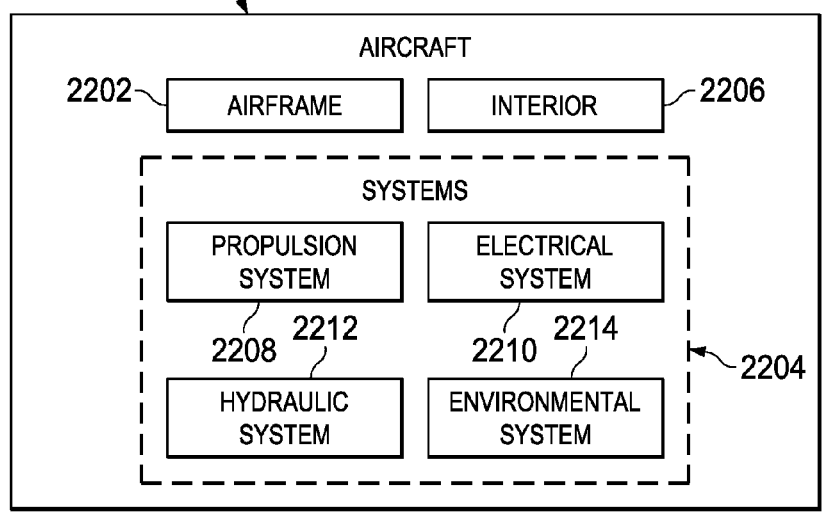

NONCONFORMANCE VISUALIZATION SYSTEM

CROSS-REFERENCE TO RELATED APPLICATION

This application is related to the following patent applications: entitled "Object Visualization System," Ser. No. 13/780,109, filed Feb. 28, 2013, "Shop Order Status Visualization System," Ser. No. 13/785,616, filed Mar. 5, 2013, "Condition of Assembly Visualization System," Ser. No. 13/834,893, filed Mar. 15, 2013, "Condition of Assembly Visualization System Based on Build Cycles," Ser. No. 13/835,262, filed Mar. 15, 2013, "Locator System for Three-Dimensional Visualization," Ser. No. 13/855,102, filed Apr. 2, 2013, "Shop Order Status Visualization System," Ser. No. 13/858,364, filed Apr. 8, 2013, "Aircraft Comparison System," Ser. No. 13/860,126, filed Apr. 10, 2013, "Nonconformance Visualization System," Ser. No. 13/861,678, filed Apr. 12, 2013, "Shop Order Status Visualization System," Ser. No. 13/890,347, filed May 9, 2013, and "Aircraft Comparison System with Synchronized Displays," Ser. No. 13/922,411, filed Jun. 20, 2013, each assigned to the same assignee, and each incorporated herein by reference.

BACKGROUND INFORMATION

1. Field

The present disclosure relates generally to manufacturing and, in particular, to manufacturing vehicles. Still more particularly, the present disclosure relates to a method and apparatus for identifying nonconformance in the assembling of vehicles in a manufacturing environment.

2. Background

The assembly of an aircraft is an extremely complex process. Hundreds of thousands of parts may be assembled for an aircraft.

The assembly of an aircraft may involve manufacturing different parts of the aircraft in geographically diverse locations. These different parts may then be finally assembled in a single location. For example, different portions of a fuselage of the composite aircraft may be assembled in different locations and flown to a central location where the final assembly line is located. Additionally, other parts such as engines, auxiliary power units, seats, computer systems, line replaceable units, or other components in aircraft may be shipped to this final location for assembly to form the assembled aircraft.

The assembly of the different parts involves assigning tasks to different operators. The assignment of these tasks may take the form of shop order instances. Each shop order instance may include instructions and an identification of parts for a particular assembly in the aircraft.

Currently, operators on the shop floor where the assembly of the aircraft occurs may need to identify locations for the assembly of parts for shop order instances. These locations are ones relative to the aircraft being assembled. The operator assigned a task to assemble a part for the aircraft may look at paper copies of the parts of aircraft to determine where to perform tasks to install or assemble parts for the aircraft. These paper copies may provide some guidance to an operator, but often times they may be difficult to understand and may not include sufficient information.

In some cases, the operator may view a computer-aided design model of an aircraft using a computer-aided design software system. These types of systems, however, require training and experience to maneuver through the model of the aircraft.

For example, an operator of the computer-aided design software system often uses aircraft coordinates to identify locations in the aircraft. Aircraft coordinates have an origin relative to some location in the aircraft. Further, when traversing through the model, locations are identified using aircraft coordinates. These aircraft coordinates, however, are not helpful to an operator that is assigned a task in a shop order instance. The aircraft coordinates may need to be translated into action locations for the operator.

For example, an operator may have a task to perform inspections on parts that have been assembled or installed. The inspection may include finding the parts on the aircraft, determining whether a nonconformance is present in the installation or assembly of the parts, and recording whether a nonconformance is present. For example, the nonconformance may be an incorrect hole location, an incorrect hole size, a nonfunctioning part, an incorrect part, or some other nonconformance.

Locating the parts for inspection may be more challenging and time-consuming than desired with current techniques for identifying locations of parts in an aircraft. As a result, operators may take more time than needed, may need additional training, or both, to view locations in the aircraft where tasks in a shop order instance are to be performed. This additional time or training may increase the time or expense needed to assemble an aircraft.

Therefore, it would be desirable to have a method and apparatus that takes into account at least some of the issues discussed above, as well as other possible issues.

SUMMARY

In one illustrative embodiment, a method for recording a nonconformance in an aircraft. A model is identified for the aircraft. Sections of the aircraft are displayed in a graphical user interface on a display device. The sections correspond to sections as manufactured for assembly of the aircraft. The sections are selectable. Graphical representations of parts are displayed in a volume in the model in the graphical user interface on a display device from a selection of a section in the sections. The volume corresponds to a location of the nonconformance in the aircraft. The nonconformance for a part is identified from a selection of a graphical representation of the part from the graphical representations of the parts. The nonconformance that was identified is recorded.

In another illustrative embodiment, a method for recording a nonconformance in an object is present. Sections of the object are displayed in a graphical user interface on a display device. The sections correspond to sections as manufactured for assembly of the object. The sections are selectable. Graphical representations of parts are displayed in a volume in a model of the object in the graphical user interface on the display device from a selection of a section in the sections. The volume corresponds to a location of the nonconformance in the object. The nonconformance for a part is identified from a selection of a graphical representation of the part from the graphical representations of the parts. The nonconformance that was identified is stored.

In yet another illustrative embodiment, an apparatus comprises an object manager configured to identify a model for an aircraft. The object manager is further configured to display sections of the aircraft in a graphical user interface on a display device. The sections correspond to sections as manufactured for assembly of the aircraft. The sections are selectable. Graphical representations of parts are displayed in a volume in the model in the graphical user interface on a display device from a selection of a section in the sections. The volume corresponds to a location of a nonconformance in the aircraft. The object manager is further configured to identify the nonconformance for a part from a selection of a graphical representation of the part from the graphical representations of the parts. The object manager is further configured to store the nonconformance that was identified.

In another illustrative embodiment, a manufacturing system comprises a control system and an object manager in the control system. The control system is configured to control manufacturing equipment configured to manufacture an aircraft. The object manager is configured to identify a model for the aircraft. The object manager is further configured to display sections of the aircraft in a graphical user interface on a display device. The sections correspond to sections as manufactured for assembly of the aircraft. The sections are selectable. Graphical representations of parts are displayed in a volume in the model in the graphical user interface on the display device from a selection of a section in the sections. The volume corresponds to a location of a nonconformance in the aircraft. The object manager is further configured to identify the nonconformance for a part from a selection of a graphical representation of the part from the graphical representations of the parts. The object manager is further configured to store the nonconformance that was identified.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 21 an illustration of an aircraft manufacturing and service method in accordance with an illustrative embodiment;

FIG. 22 an illustration of a block diagram of an aircraft in which an illustrative embodiment may be implemented;

DETAILED DESCRIPTION

The illustrative embodiments recognize and take into account one or more different considerations. For example, the illustrative embodiments recognize and take into account that in performing tasks in shop order instances, operators may look at a visualization of the aircraft. For example, the illustrative items recognize and take into account that the operators may look at a model of an aircraft with the parts. The illustrative embodiments recognize and take into account that this process, however, is a tedious process.

For example, the illustrative embodiments recognize and take into account that this process may be particularly cumbersome when performing inspections. Some shop order instances may be for an inspection of a part assembled as part of a task performed in another shop order instance. In this case, the inspection may include identifying nonconformances in the assembly of one or more parts.

In this case, an operator finds a group of parts that have been assembled. An inspection is made as to whether a nonconformance is present in the group of parts. The operator may make notes and enter the nonconformance after inspecting the group of parts at a workstation elsewhere in the building where the aircraft is being assembled or in another location.

This process involves the operator identifying the location in the aircraft and the group of parts where the nonconformance is located. The operators on the shop floor performing inspections are often not experienced or trained in using computer-aided design software used to view the models.

Viewing a model of an aircraft may take more time and effort than desired. For example, operators may require additional training. In some cases, operators may rely on other operators with training and experience. Thus, looking at parts in a model may take more time and effort than desired.

The illustrative embodiments provide a method and apparatus for visually querying an aircraft. A model is identified for the aircraft. Sections of the aircraft are displayed in a graphical user interface on a display device. The sections correspond to sections as manufactured for assembly of the aircraft. The sections are selectable.

Figure 1:
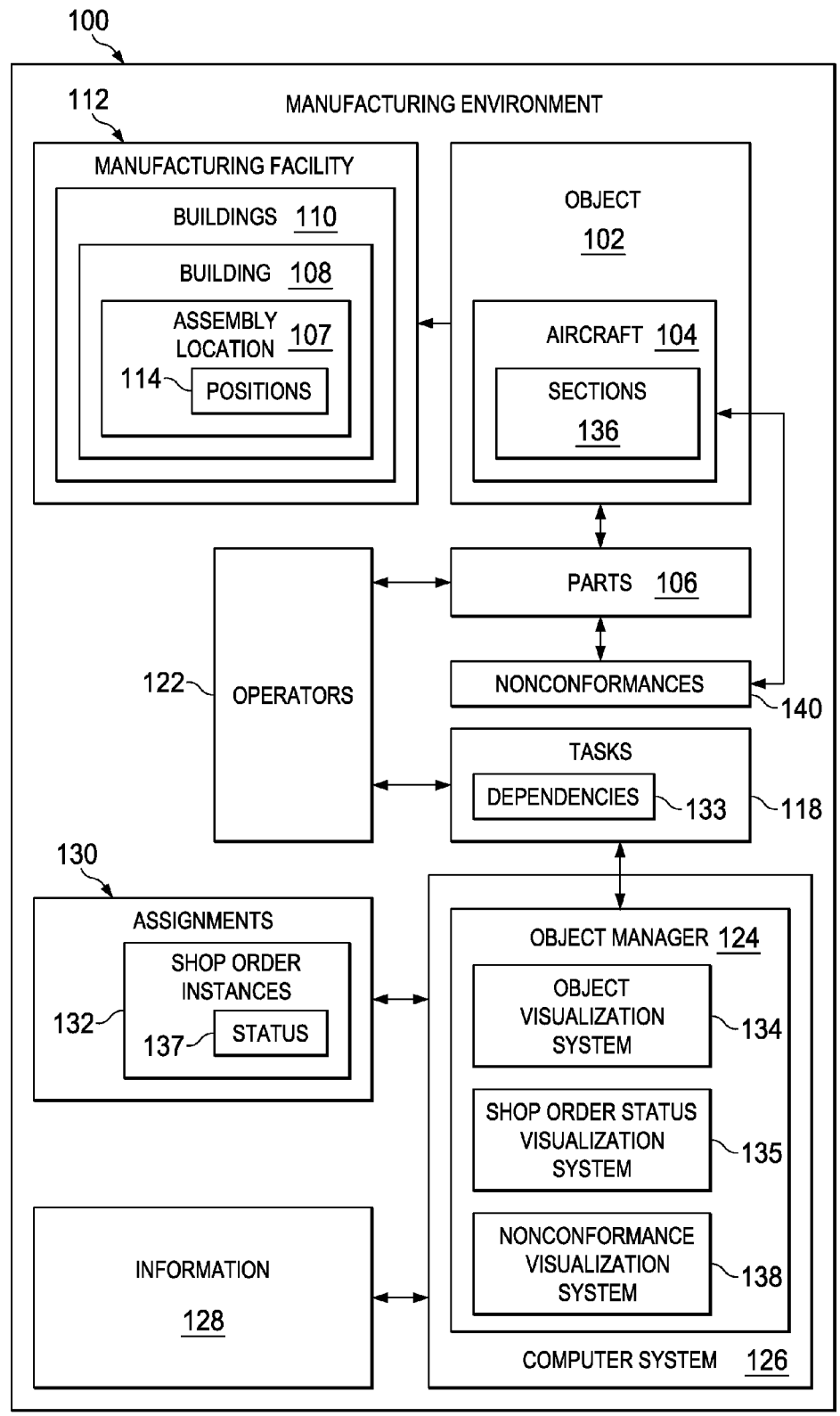
FIG. 1 is an illustration of a block diagram of a manufacturing environment in accordance with an illustrative embodiment.

With reference now to the figures, and in particular, with reference to FIG. 1, an illustration of a block diagram of a manufacturing environment is depicted in accordance with an illustrative embodiment. Manufacturing environment 100 is an example of an environment in which object 102 may be assembled.

In this illustrative example, object 102 takes the form of aircraft 104. Object 102 is completed by assembling parts 106. A part is a group of the components. As used herein, a "group of," when used with reference items, means one or more items. For example, a group of components is one or more components.

A part may be a single component or assembly of components in these depicted examples. For example, the part may be a seat, a row of seats, an in-flight entertainment system, a duct, a system of ducts, a global positioning system receiver, an engine, an engine housing, an inlet, or other suitable types of parts.

In this illustrative example, assembling parts 106 may take place in assembly location 107 in building 108 of buildings 110 at manufacturing facility 112. The assembly of parts 106 in building 108 may occur in positions 114 in assembly location 107 for object 102. Each position in positions 114 is a location in building 108 in which a group of tasks 118 is performed to assemble object 102.

In these illustrative examples, a task is a piece of work. A task may be comprised of one or more operations that are performed by a group of operators 122 assigned to work on the assembly of object 102.

In the illustrative examples, object manager 124 may be used to manage the assembly of object 102. When object 102 is aircraft 104, object manager 124 may be part of an aircraft management system. Object manager 124 may be implemented in software, hardware, firmware or a combination thereof. When software is used, the operations performed by object manager 124 may be implemented in program code configured to run on a processor unit. When firmware is used, the operations performed by object manager 124 may be implemented in program code and data and stored in persistent memory to run on a processor unit. When hardware is employed, the hardware may include circuits that operate to perform the operations in object manager 124.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, or other suitable hardware devices. Additionally, the processes may be implemented in organic components integrated with inorganic components and/or may be comprised entirely of organic components excluding a human being. For example, the processes may be implemented as circuits in organic semiconductors.

As depicted, object manager 124 may be implemented in computer system 126. Computer system 126 is one or more computers. When more than one computer is present, the computers in computer system 126 may communicate with each other using a communications medium such as a network. Computer system 126 may be located all in the same location or in different geographic locations. For example, computer system 126 may be distributed through buildings 110 or located in building 108. Portions of computer system 126 may even be located in another geographic location separate from manufacturing facility 112.

In managing the assembly of object 102, object manager 124 may manage tasks 118 and information 128 about object 102. In this illustrative example, the management of tasks 118 may include at least one of assigning tasks 118 to operators 122, monitoring the status of tasks 118, organizing tasks 118, providing information about tasks 118, or other suitable operations. Information 128 may include, for example, the models of objects, part inventories, or other suitable information relating to object 102.

As used herein, the phrase "at least one of," when used with a list of items, means different combinations of one or more of the listed items may be used and only one of each item in the list may be needed. For example, "at least one of item A, item B, and item C" may include, without limitation, item A or item A and item B. This example also may include item A, item B, and item C or item B and item C. The item may be a particular object, thing, or a category. In other words, at least one of means any combination of items and number of items may be used from the list but not all of the items in the list are required.

In these illustrative examples, object manager 124 may manage tasks 118 using assignments 130 in the form of shop order instances 132. For example, object manager 124 may assign tasks through the use of shop order instances 132 to operators 122 for performance and assembling of object 102. Additionally, the status of shop order instances 132 may be used to identify the state of assembly of object 102 by operators 122.

Additionally, tasks 118 may have dependencies 133. In other words, tasks 118 may be performed in a particular order. Dependencies 133 may dictate when tasks within tasks 118 should be performed relative to other tasks in tasks 118. Dependencies 133 may also be for parts 106 in addition to or in place of tasks 118. In this form, dependencies 133 may result in dependencies 133 for tasks 118.

As a result, dependencies 133 may affect the manner in which assignments 130 are made as shop order instances 132. In particular, dependencies 133 may be used to determine when shop order instances 132 should be performed.

In these illustrative examples, object manager 124 may provide different functions and capabilities for assembling object 102. For example, object manager 124 may include at least one of object visualization system 134, shop order status visualization system 135, or other types of systems.

The systems may be implemented using hardware, software, or some combination thereof.

In one illustrative example, object visualization system 134 may provide a visualization of object 102 to operators 122. In particular, operators 122 may perform queries using object visualization system 134 to view a number of sections 136 in object 102. In particular, sections 136 may be sections that correspond to sections at manufacturing facility 112 for assembly of object 102, such as aircraft 104.

In these illustrative examples, the manufacturing may include at least one of fabricating components for parts, assembling components to form parts, assembling parts for object 102, or some other suitable manufacturing operation performed to assemble object 102.

For example, object manager 124 may provide visual information about all of object 102 or one or more specific sections of object 102. This type of visualization may be especially useful when object 102 takes the form of aircraft 104. Information 128 may be used when operators 122 perform tasks 118 with respect to parts 106 to assemble aircraft 104.

In another illustrative example, shop order status visualization system 135 may provide a visualization of status 137 of shop order instances 132. This information may be provided visually to operators 122. In particular, object manager 124 may function as shop order status visualization system 135 as well as provide other suitable functions in managing the assembly of object 102.

As another illustrative example, object manager 124 may also include nonconformance visualization system 138. Nonconformance visualization system 138 may be used to manage nonconformances 140 that may be identified for parts 106 assembled to form aircraft 104.

In these illustrative examples, a nonconformance in nonconformances 140 is present when a part in parts 106 does not meet some group of criteria. For example, the criteria may be selected from at least one of a tolerance of the part, a tolerance of components forming the part, a tolerance of fit of the part with other parts, a size of a hole, whether an inconsistency is present in a part, whether the part functions as desired when assembled in aircraft 104, or other suitable criteria with respect to whether a part or a group of parts in parts 106 meet the group of criteria.

Figure 2:
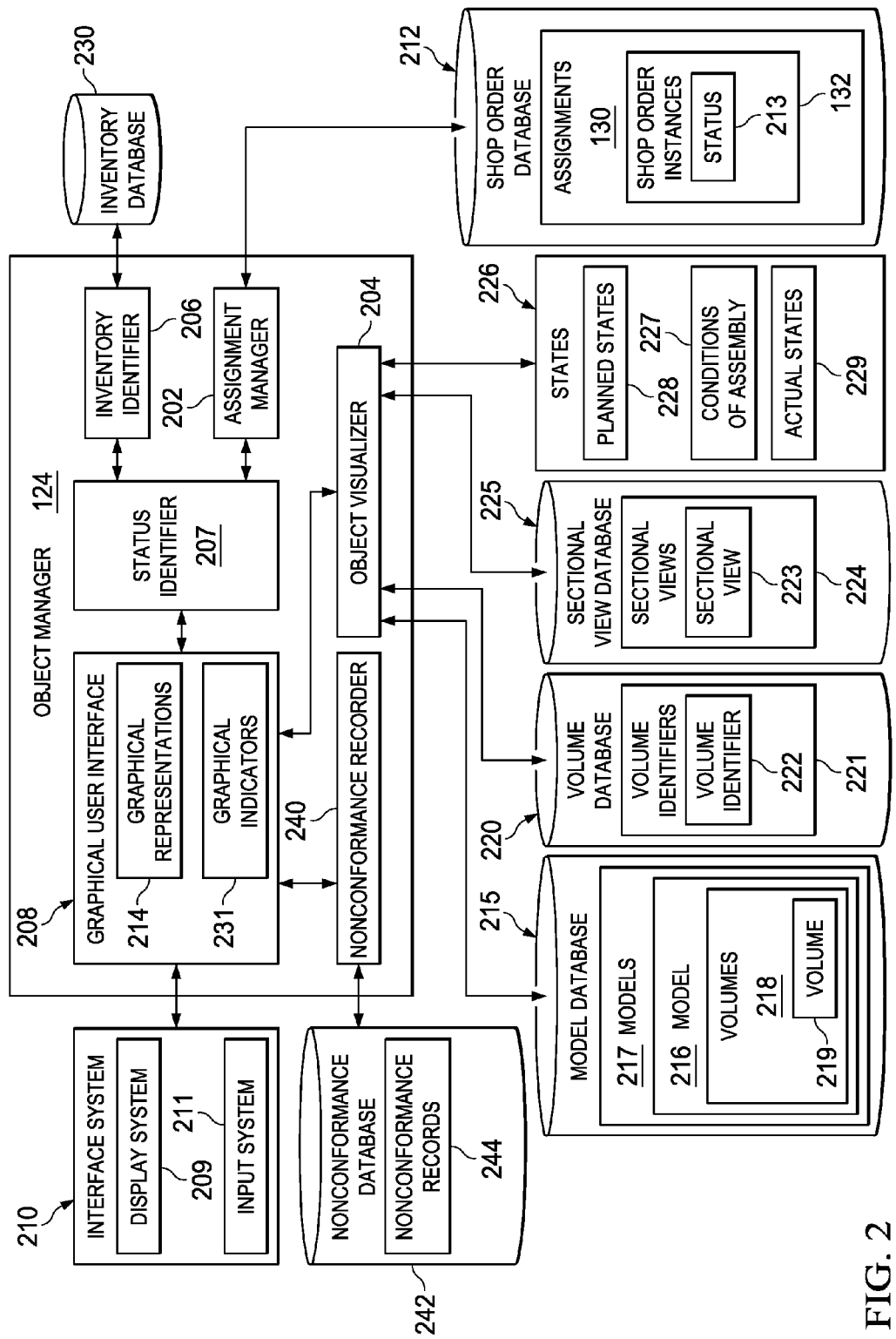
FIG. 2 is an illustration of a block diagram of an object manager in accordance with an illustrative embodiment.

Turning now to FIG. 2, an illustration of a block diagram of an object manager is depicted in accordance with an illustrative embodiment. Examples of components that may be implemented in object manager 124 are shown in this figure.

As depicted, object manager 124 includes a number of different components. For example, object manager 124 includes assignment manager 202, object visualizer 204, inventory identifier 206, status identifier 207, and graphical user interface 208. These different components along with object manager 124 may be implemented using hardware, software, or some combination thereof.

Graphical user interface 208 is configured to provide an interface for operators 122 to interact with object manager 124. In these illustrative examples, graphical user interface 208 may be displayed on display system 209 in interface system 210. Display system 209 is hardware and may include one or more display devices selected from at least one of a liquid crystal display (LCD), a light emitting display (LED), an organic light emitting display (OLED), or other suitable types of display devices.

Input may be received from operators 122 through input system 211 in interface system 210. Input system 211 is a hardware system. Input system 211 may include one or more devices. These devices may include at least one of a keyboard, a mouse, a joystick, a touchscreen panel, or other suitable types of devices.

In this illustrative example, assignment manager 202 is configured to manage assignments 130 in the form of shop order instances 132 in shop order database 212. For example, assignment manager 202 may be used to assign tasks 118 to operators 122 using shop order instances 132. Additionally, assignment manager 202 also may be configured to receive information about the performance of tasks 118 assigned through shop order instances 132. This information may be used by assignment manager 202 to generate and update status 213 for shop order instances 132.

Object visualizer 204 is configured to generate graphical representations 214 for parts 106. Graphical representations 214 may be displayed on graphical user interface 208 in display system 209. As depicted, object visualizer 204 is configured to access model database 215. Object visualizer 204 may identify model 216 from models 217 in model database 215 for object 102 and, in particular, for aircraft 104. Model 216 is used to generate graphical representations 214 in the illustrative example.

In these illustrative examples, graphical representations 214 may be generated for sections 136 of object 102, which may take the form of aircraft 104. In this illustrative example, model 216 may be identified for object 102 from models 217 in model database 215. Models 217 may take various forms. For example, without limitation, models 217 may include computer-aided design (CAD) files.

Each model in models 217 may be for a particular object. The objects may be of the same type but for different shop order instances. For example, if models 217 are for a particular type of aircraft, each model may be for a particular aircraft that is being assembled for a customer. The different models may be for the same aircraft model but may have variations for different options selected by a customer. In other illustrative examples, models 217 may include models for different types of aircraft 104.

The generation of graphical representations 214 may be based on all of model 216 or a group of volumes 218 in model 216. These items may have different shapes. For example, volume 219 in volumes 218 may be a cube, a cuboid, a cylinder, a sphere, or some other suitable shape.

In these illustrative examples, volume 219 is for at least a portion of a part in parts 106 of object 102. Volume 219 may be large enough to encompass the part. Volume 219 may also be larger than the part. In these illustrative examples, volume 219 may comprise an amount of space around the part for viewing the part in a graphical user interface. For example, the amount of space around the part may be for viewing the part in the graphical user interface from one or more angles. In this example, the one or more angles may be one or more angles from the point of view of an operator. In this example, the point of view of the operator may be of an operator performing a task associated with the part.

As depicted, volumes 218 may be identified in model 216 using volume database 220. Volume database 220 is a collection of information that may be used to identify which volumes in volumes 218 may be displayed as graphical representations 214. In particular, the collection of information may include volume identifiers 221. For example, volume identifier 222 in volume identifiers 221 may define volume 219 in volumes 218.

In these illustrative examples, an identification of volume 219 may be made using sectional view 223 in sectional views 224 in sectional view database 225. Sectional views 224 may include sectional views of the different objects. For example, sectional view 223 may correspond to model 216. An operator may select volumes 218 using sectional view 223 displayed on graphical user interface 208 in this particular example.

As depicted, sectional views 224 in sectional view database 225 may provide views of sections 136 for object 102. In the illustrative examples, sections 136 correspond to sections manufactured for assembly of object 102. In particular, sections 136 may correspond to sections manufactured for assembly of aircraft 104.

Further, sectional views 224 may include different levels of detail. For example, sectional views 224 may include a hierarchy of levels in which the lower levels have more detail about aircraft 104 then higher levels in the hierarchy. In some illustrative examples, a selection of a sectional view in sectional views 224 may result in another sectional view being displayed. In other illustrative examples, a selection made in a sectional view may result in graphical representations 214 being generated from model 216 and displayed on graphical user interface 208. In this manner, an operator may visually query aircraft 104 through the different sectional views in sectional views 224.

As a result, operator interaction generating user input with sectional view 223 displayed in graphical user interface 208 may be used to identify volumes 218 in model 216. The user input may be used to identify volume identifier 222 from volume identifiers 221. Volume identifier 222 may point to volume 219 in model 216.

In these illustrative examples, object visualizer 204 may generate queries using volume identifiers 221 to obtain information from model 216 in model database 215. In particular, information may be data about volume 219 in model 216 for aircraft 104.

As depicted, object visualizer 204 also may be configured to generate graphical representations 214 for states 226 of object 102. In these illustrative examples, states 226 may be used for object 102 in the form of aircraft 104. In other words, aircraft 104 may have different parts in parts 106 that are installed at different states within states 226. In the illustrative examples, states 226 may take the form of conditions of assembly 227 for object 102.

For example, states 226 may be based on positions 114 of aircraft 104 within assembly location 107 in building 108. In these illustrative examples, states 226 be selected from at least one of planned states 228 or actual states 229.

Aircraft 104 may have different planned states in planned states 228 in different positions in positions 114. In this illustrative example, a planned state in planned states 228 includes the parts that are expected to be installed at a particular position in positions 114. In other words, these parts may or may not have been installed at that position.

In these illustrative examples, the planned state may be based on the past position, current position, or the future position of aircraft 104 in positions 114. In other words, graphical representations 214 may be generated for any position that is present for planned states 228 for aircraft 104.

As depicted, an actual state in actual states 229 includes parts 106 that have actually been installed in aircraft 104. In other words, a particular state may have a selected number of parts that are installed at that state. The actual state in actual states 229 may be based on at least one of a past position, or the current position of aircraft 104. In other words, graphical representations 214 may be generated for parts 106 actually installed at a prior point in time. This prior point in time may be selected by an operator. In this manner, an operator may view tasks 118 performed to install parts 106 at some prior point in time.

Additionally, the actual state may be the current state of aircraft 104. In other words, graphical representations 214 may be generated for parts 106 that have been installed at the current point in time. In this manner, graphical representations 214 may be used to visualize parts 106 that are currently present in aircraft 104.

In these illustrative examples, the identification of parts that have already been installed or parts installed in prior points in time may be identified using shop order instances 132. In particular, shop order instances 132 may indicate whether or what parts in parts 106 have been installed.

Model database 215 is a database of models for objects. In these illustrative examples, these models may be, for example, computer-aided design models (CAD). Of course, any type of model that may provide information about the three-dimensional geometries of objects may be used. Additionally, these models may also include other information about materials, instruction assemblies, or other suitable types of information.

As depicted, inventory identifier 206 is configured to access inventory database 230. Inventory database 230 contains information about parts. Inventory database 230 may include information about whether parts are in stock, when parts will be delivered, the number of parts available, or other suitable types of information.

As depicted, status identifier 207 is configured to provide a visualization of the status for one or more of shop order instances 132. In this illustrative example, status identifier 207 is configured to provide an operator a graphical front end through graphical user interface 208 to identify the status of a shop order instance in a specific location of object 102, such as aircraft 104. This information may be identified without the operator knowing the coordinates of the particular location.

In these illustrative examples, object visualizer 204 is configured to identify a model of object 102, such as aircraft 104. For example, object visualizer 204 may identify the model in model database 215 for object 102.

Status identifier 207 is also configured to identify shop order instances 132 for object 102. The identification may be made through interaction with assignment manager 202.

In this illustrative example, status identifier 207 is also configured to identify status 213 of shop order instances 132. This identification also may be made through assignment manager 202.

Object visualizer 204 is configured to display graphical representations 214 of parts 106 in FIG. 1 for a group of shop order instances 132 in graphical user interface 208 on a display device in display system 209. The generation of graphical representations 214 may be based on the identification of a group of shop order instances 132. In other words, object visualizer 204 is configured to receive an identification of parts in the group of shop order instances 132. The identification of these parts may be used to generate graphical representations 214.

Further, status identifier 207 is also configured to display a set of graphical indicators 231 in association with graphical representations 214 of parts 106 displayed on graphical user interface 208 by object visualizer 204. As used herein, a "set of," when used with reference items, means one or more items. For example, a set of graphical indicators 231 is one or more of graphical indicators 231.

In these illustrative examples, a graphical indicator in graphical indicators 231 is considered to be displayed in association with a graphical representation in graphical representations 214 when the attention of an operator viewing graphical indicators 231 is drawn to the parts. Thus, the graphic indicator may be displayed as part of the graphical representation, on the graphical representation, in some proximity of the graphical representation, or in some other suitable manner that draws attention to the graphical representation.

The set of graphical indicators 231 displayed in association with graphical representations 214 of parts 106 may take different forms. For example, the set of graphical indicators 231 may be selected from at least one of a color, cross hatching, an icon, highlighting, animation, or other suitable types of graphical indicators.

Further, the group of shop order instances 132 may be identified in a number of different ways. For example, the group of shop order instances 132 may be identified by a user input to graphical user interface 208 from an operator. For example, the user input received may be a selection of the group of shop order instances 132.

In another illustrative example, the identification of the group of shop order instances 132 may be identified from a user input selecting a group of parts 106 in object 102 in FIG. 1. The selection of the group of parts 106 may be one of a selection of the group of parts 106 from a list of parts 106 and a selection of the group of parts 106 from a display of graphical representations 214 of parts 106 in graphical user interface 208.

Additionally, status identifier 207 may display information about a shop order instance for a part selected from graphical representations 214 of parts 106 displayed in graphical user interface 208.

With this information in graphical user interface 208, real-world operations may be performed. For example, the assembly of object 102 in FIG. 1 may be managed based on graphical representations 214 of parts 106 for shop order instances 132 and the set of graphical indicators 231 displayed on graphical user interface 208. For example, identifications of operations that should be performed may be made using this visualization. These operations may include when particular parts should be assembled, when inspections of parts assembled in object 102 should be made, or other suitable types of operations.

Additionally, in some illustrative examples, nonconformance recorder 240 may be included in object manager 124. Nonconformance recorder 240 may be part of nonconformance visualization system 138 in object manager 124. Further, other components also may be part of nonconformance visualization system 138 depending on the particular implementation. For example, object visualizer 204 also may be part of nonconformance visualization system 138.

In this illustrative example, nonconformance recorder 240 may record nonconformances 140 in FIG. 1 in nonconformance database 242. Nonconformance database 242 contains nonconformance records 244.

Nonconformance records 244 record information about nonconformances 140. With nonconformance records 244, an analysis may be made of nonconformances 140. The assembly of aircraft 104 may be managed based on an identification of nonconformances 140 for aircraft 104. The identification of nonconformances 140 may be analyzed to determine whether changes in the manner in which aircraft 104 is manufactured should be made. The analysis may also be used to change manufacturing of future aircraft to reduce the occurrence of nonconformances.

In FIG. 2, different components are illustrated as being located in object manager 124. These different components may be used as part of different systems. The systems may include at least one of object visualization system 134, shop order status visualization system 135, and other suitable systems. A component in object manager 124 may be used in more than one system. For example, object visualizer 204 may be in object visualization system 134, shop order status visualization system 135, or nonconformance visualization system 138. In other words, the different components illustrated in object manager 124 may be used at the same time or at different times by different systems.

Figure 3:
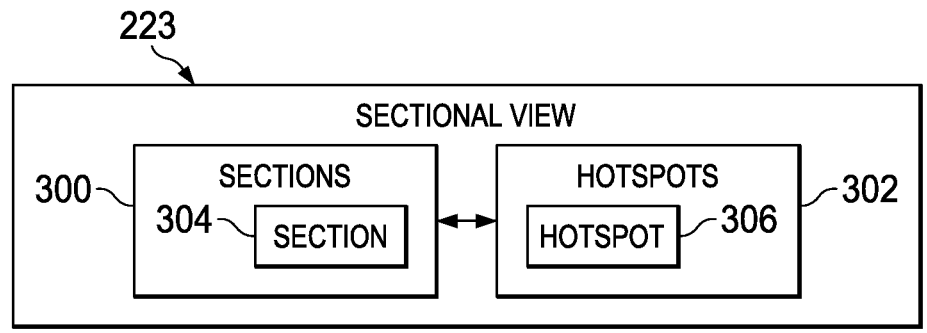
FIG. 3 is an illustration of a block diagram of a sectional view in accordance with an illustrative embodiment.

Turning now to FIG. 3, an illustration of a block diagram of a sectional view is depicted in accordance with an illustrative embodiment. An example of one implementation for sectional view 223 in FIG. 2 is shown.

As depicted, sectional view 223 includes a number of different pieces of information. For example, sectional view 223 includes sections 300 and hotspots 302.

Sections 300 are graphical representations corresponding to sections 136 for object 102 and, in particular, aircraft 104 in FIG. 1. In these illustrative examples, sections 300 may be located in a single image, multiple images, or some other suitable form. Further, sections 300 are graphical representations corresponding to sections 136 manufactured for assembly of aircraft 104.

In these illustrative examples, sections 300 may be selectable. A selection of section 304 in sections 300 having hotspot 306 results in a volume corresponding to section 304 in model 216 being displayed in this illustrative example. Hotspot 306 may be a pointer to volume identifier 222 associated with volume 219. For example, hotspot 306 may include a universal resource locator, or some other suitable addressing convention to identify volume identifier 222 from volume identifiers 221 in volume database 220.

Figure 4:
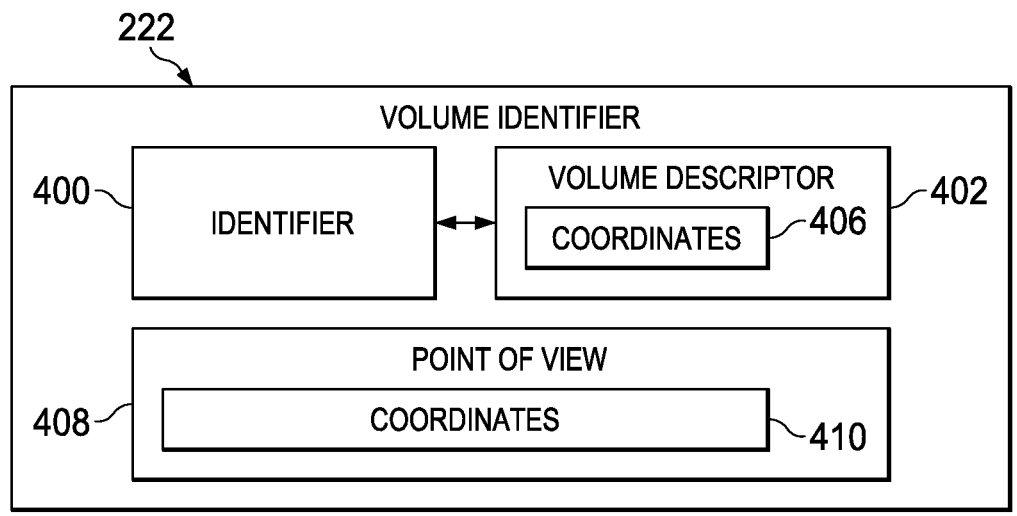
FIG. 4 is an illustration of a block diagram of a volume identifier in accordance with an illustrative embodiment.

Turning now to FIG. 4, an illustration of a block diagram of a volume identifier is depicted in accordance with an illustrative embodiment. In this illustrative example, one implementation for volume identifier 222 in FIG. 2 is shown.

Volume identifier 222 includes a number of components. As depicted, volume identifier 222 includes identifier 400 and volume descriptor 402.

Identifier 400 distinguishes volume identifier 222 from others of volume identifiers 221 that may be present in volume database 220. Identifier 400 may take various forms. For example, identifier 400 may be a word, a phrase, a number, an alphanumeric string, or some other suitable form.

Volume descriptor 402 describes the volume in model 216. For example, volume descriptor 402 may take the form of coordinates 406. Coordinates 406 are in the coordinate system used by model 216 in this example. For example, coordinates 406 may be three coordinates that may be used to define a polygon, a cube, or a cuboid. Of course, other information may be present in volume descriptor 402 other than coordinates 406. For example, volume descriptor 402 may include a single coordinate and a radius used to define volume 219 in a form of a sphere. In still other illustrative examples, a single coordinate may be present with preselected offsets that define volume 219 as a cube or some other shape.

In some illustrative examples, the volume identifier may also include point of view 408. Point of view 408 may define the view of the volume displayed to an operator when graphical representations 214 are displayed on graphical user interface. For example, point of view 408 may include coordinates 410 of the point of view using the coordinate system for the volume.

Figures 5, 6:
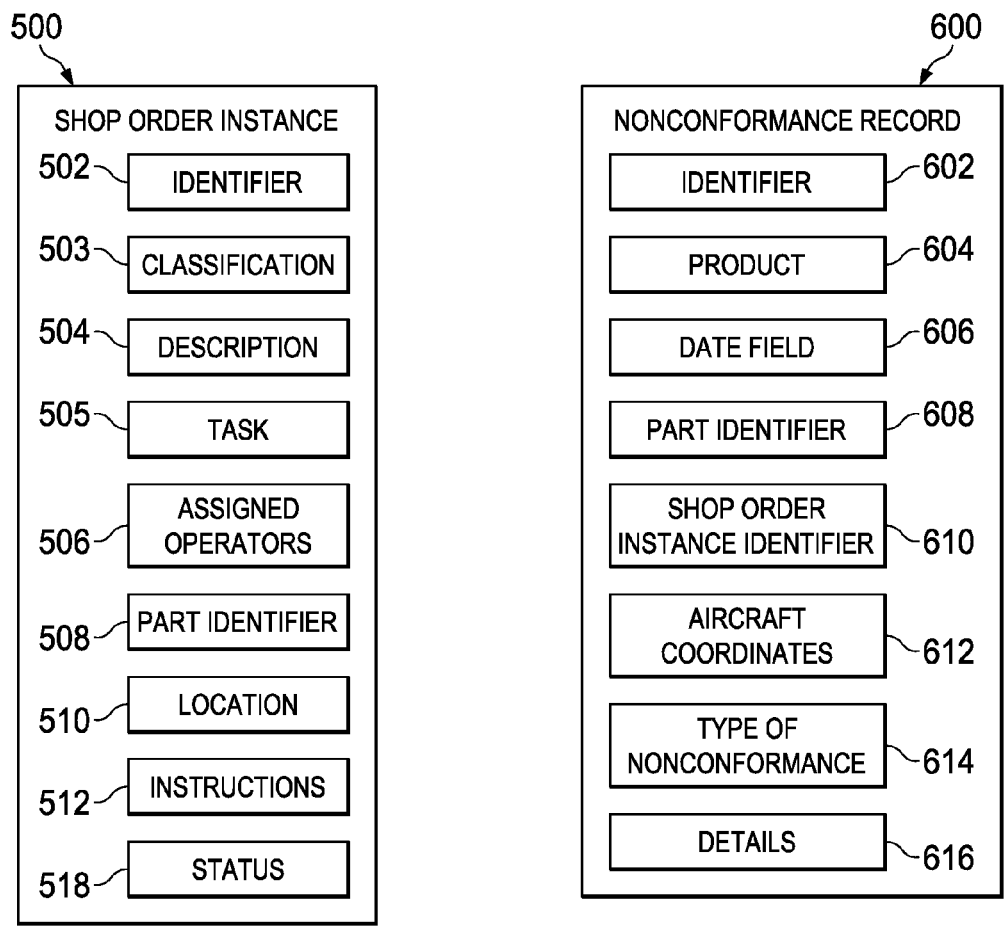
FIG. 5 is an illustration of a block diagram of a shop order instance in accordance with an illustrative embodiment.
FIG. 6 is an illustration of a block diagram of a nonconformance record in accordance with an illustrative embodiment.

With reference now to FIG. 5, an illustration of a block diagram of a shop order instance is depicted in accordance with an illustrative embodiment. As depicted, shop order instance 500 is an example of a shop order instance from shop order instances 132 in FIG. 1.

As depicted, shop order instance 500 may include a number of different parts. Shop order instance 500 includes identifier 502, classification 503, description 504, task 505, assigned operators 506, part identifier 508, location 510, instructions 512, and status 518.

As depicted, identifier 502 may be used to uniquely identify a task in tasks 118 in FIG. 1. Identifier 502 may be an alphanumeric identifier, a number, or some other suitable type of identifier.

In this illustrative example, classification 503 is used to classify the shop order instance. This classification may be based on the type of task to be performed. For example, the classifications may include seat installation, wiring, line replaceable unit installation, or other suitable types of classifications. The classification may be descriptive or may take the form of an identifier or other type of code.

Description 504 provides a description of task 505. This description may be a short description to provide the operator information about task 505. The description may be several words or a single sentence in some illustrative examples.

Task 505 identifies the work to be performed. For example, task 505 may be to install a part, assemble parts, perform an inspection, or some other suitable piece of work.

Assigned operators 506 identifies a group of operators that may be assigned to perform task 505. In some cases, an operator may not yet be assigned to perform task 505 for shop order instance 500.

In this illustrative example, part identifier 508 identifies a part assembled in object 102 using shop order instance 500. In this illustrative example, part identifier 508 is a part number for the part. For example, part identifier 508 may be a serial number, a combination of a serial number and vendor identifier, or some other suitable type of identification that uniquely identifies a particular part from other parts even if those parts are the same type.

In the illustrative examples, part identifier 508 may be used to generate the graphical representation of the parts identified. For example, part identifier 508 may be used to locate the information in a model needed to generate the graphical representation of the part for display.

Location 510 identifies the location where task 505 is to be performed. This location may be in coordinates for object 102 or some other coordinate system.

Instructions 512 are a group of instructions for performing task 505. In particular, the group of instructions may be for assembling a group of parts. These instructions may be step-by-step instructions, guidance, or other suitable types of instructions. These instructions may provide guidance for assembling parts, inspecting parts, or other suitable operations that may be performed for task 505. Instructions 512 also may include plans for the location in which task 505 is to be performed.

As depicted, status 518 provides information about the performance of task 505 for shop order instance 500. In this illustrative example, the status may indicate that work is to be performed, has been completed, is in progress, is unassigned, has been planned, is on hold, has been canceled, or some other suitable status for shop order instance 500. The status may be indicated using text, codes, symbols, or other suitable mechanisms. Additionally, if status 518 indicates that the work to be performed has been completed, status 518 also may include a date and time of when work for performing task 505 occurred.

With reference now to FIG. 6, an illustration of a block diagram of a nonconformance record is depicted in accordance with an illustrative embodiment. In this illustrative example, nonconformance record 600 is an example of a record that may be made for a nonconformance in nonconformances 140 in FIG. 1. In particular, nonconformance record 600 is an example of one implementation for a nonconformance record in nonconformance records 244 in nonconformance database 242 in FIG. 2.

In this illustrative example, nonconformance record 600 includes a number of different fields in which to record information about a nonconformance. As depicted, nonconformance record 600 includes, for example, identifier 602, product 604, date field 606, part identifier 608, shop order instance identifier 610, aircraft coordinates 612, type of nonconformance 614, and details 616.

Identifier 602 may be a unique identifier that identifies nonconformance record 600 with respect to other nonconformance records. This identifier may take various forms. For example, identifier 602 may be in the form of characters, numbers, a mix of characters and numbers, or some other suitable form.

Product 604 identifies the product. For example, product 604 may identify a particular model, line, or other identification for the aircraft in this example.

As depicted, date field 606 may indicate a date when the inspection was performed. Date field 606 also may include a time, depending on the particular implementation.

Part identifier 608 identifies one or more parts in which the nonconformance has been identified. Part identifier 608 may be similar to part identifier 508 in shop order instance 500 in FIG. 5.

Shop order instance identifier 610 identifies a particular shop order instance in this illustrative example. For example, shop order instance identifier 610 may be used to identify the shop order instance in shop order instances 132 within shop order database 212 in FIG. 2.

In this illustrative example, aircraft coordinates 612 identify the location of the nonconformance. In this illustrative example, the identification is made by using the coordinate system for the aircraft. This coordinate system may have an origin selected somewhere within or somewhere outside the aircraft, depending on the particular implementation.

Type of nonconformance 614 provides more information about the nonconformance. This field may be used to categorize nonconformance. For example, type of nonconformance 614 may be a part fit that is out of tolerance, an incorrect part, a hole with dimensions out of tolerance, a hole in an incorrect location, a nonworking part, or some other suitable category.

In this illustrative example, details 616 is a field that provides more specific information about the nonconformance. Details 616 may include notes that may be entered by an operator performing the inspection identifying the nonconformance.

Of course, the fields illustrated in nonconformance record 600 are only examples of some fields that may be used in nonconformance record 600. Other fields may be used in addition to or in place of the ones depicted. For example, an owner field identifying the operator performing the inspection that identified the nonconformance may be included. As another illustrative example, a position field may be present that identifies the position of an aircraft within an assembly line when the nonconformance is identified.

The illustration of the different components that may be used in manufacturing environment 100 in FIGS. 1-5 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment. For example, although the illustrative examples are described with respect to an aircraft, an illustrative embodiment may be applied to other objects other than aircraft, such as, for example, without limitation, a vehicle, a submarine, a personnel carrier, a tank, a train, an automobile, a bus, a spacecraft, a surface ship, a spacecraft, a satellite, a rocket, an engine, a computer, harvesters, construction cranes, bulldozers, mining equipment, or other suitable types of objects.

With reference now to FIGS. 7-15, illustrations of the display of graphical user interfaces for viewing an aircraft and identifying nonconformances are depicted in accordance with an illustrative embodiment. These figures illustrate one manner in which graphical user interface 208 in FIG. 2 may be implemented. The different graphical user interfaces may be displayed on a display system, such as display system 209 in FIG. 2, and an operator may interact with the graphical user interfaces using an input system, such as input system 211 in FIG. 2.

Figure 7:
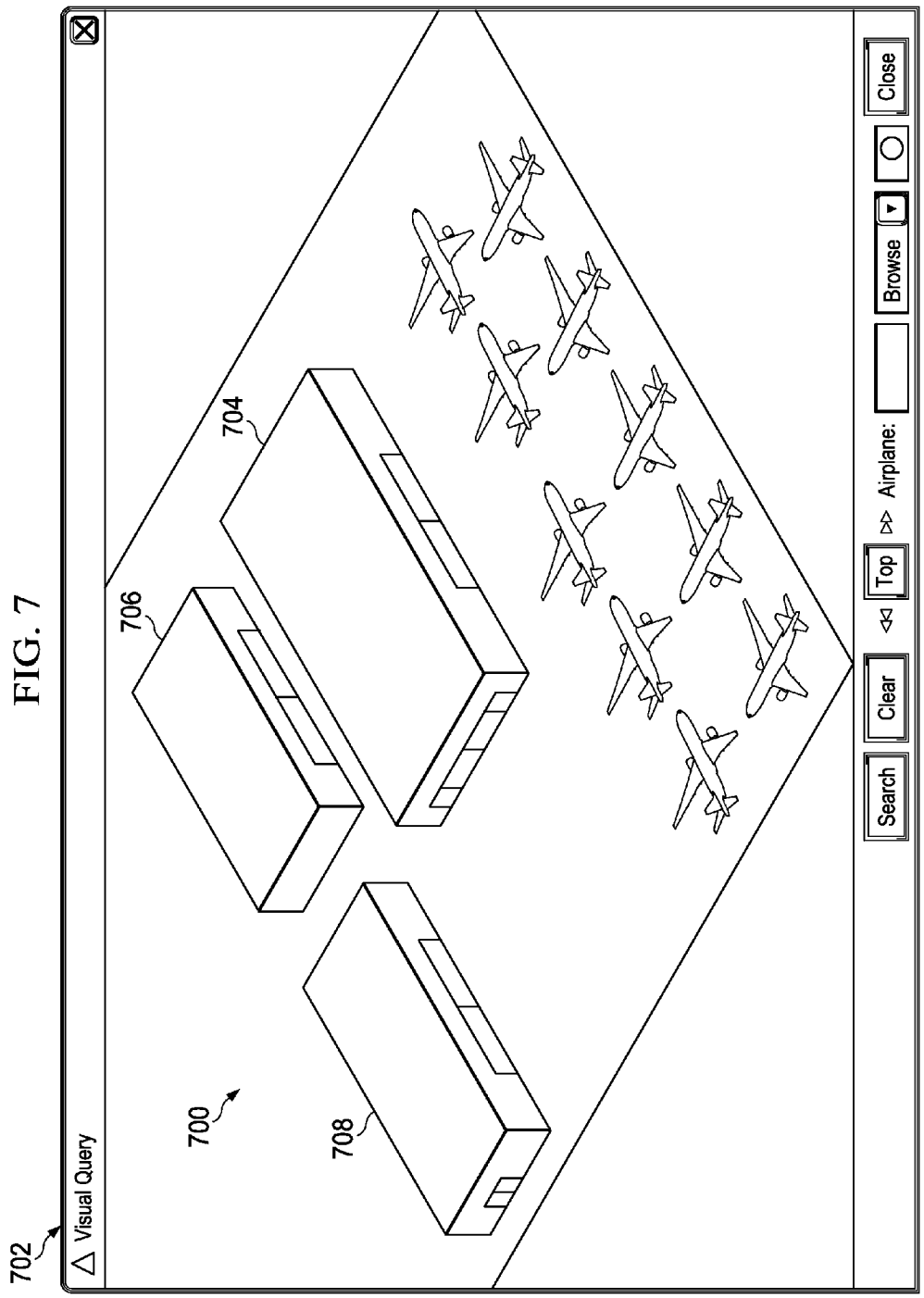
FIG. 7 is an illustration of a graphical user interface for viewing statuses of shop order instances in accordance with an illustrative embodiment.

With reference to FIG. 7, an illustration of a graphical user interface for viewing statuses of shop order instances is depicted in accordance with an illustrative embodiment. In this illustrative example, graphical user interface 700 displays buildings 702 including building 704, building 706, and building 708.

In this particular example, each building in buildings 702 in graphical user interface 700 represents a location where manufacturing of aircraft occurs. Each building may correspond to a database of aircraft that are manufactured within the building.

Figure 8:
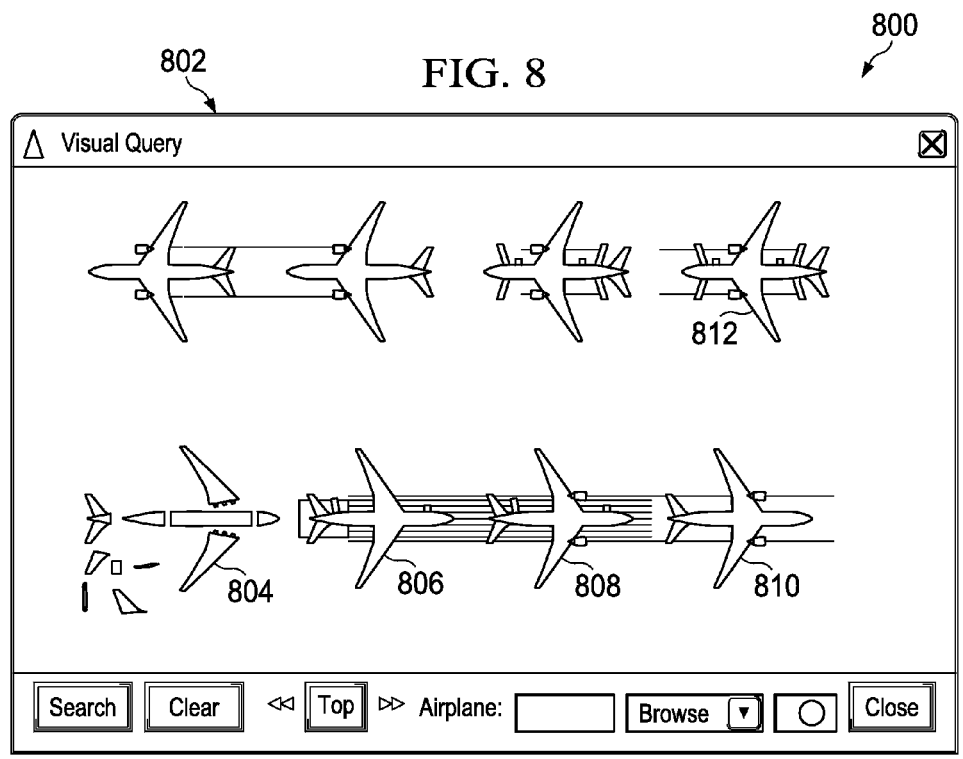
FIG. 8 is an illustration of aircraft positions in a building in accordance with an illustrative embodiment.

Turning now to FIG. 8, an illustration of aircraft positions in a building is depicted in accordance with an illustrative embodiment. In this illustrative example, aircraft positions 800 are displayed in graphical user interface 802. These positions correspond to tasks that may be performed at different stages of the assembly of an aircraft.

In this particular example, aircraft positions 800 include position 804, position 806, position 808, position 810, and position 812. In these illustrative examples, certain tasks are performed in different positions in aircraft positions 800. In other words, the aircraft assembly progresses from position to position with different parts being added to the aircraft at the different positions in aircraft positions 800.

A selection of one of these positions results in identifying graphical representations for parts that would be installed at a particular position as well as any parts that may have been installed from a prior position. As a result, parts that are not to be installed into a subsequent position are not present. For example, an aircraft in position 812 is a fully configured aircraft. An aircraft in position 810 may not have seats and carpet. An aircraft in position 808 may not include stove ends, lavatories, galleys, and other parts. These different positions in aircraft positions 800 may have different conditions of assembly of the aircraft in these illustrative examples.

In these illustrative examples, each of these positions may have models associated with the position. These models may contain the parts that are present in the aircraft for a particular position. As a result, a selection of a position results in a selection of models that may be used to display graphical representations of parts. As a result, models for positions with fewer parts may be queried more quickly to identify information to generate graphical representations of parts for the aircraft.

Additionally, in these illustrative examples, shop order instances in a shop order database may be identified for each of the positions. In other words, each position may have a shop order database containing shop order instances that may be generated for those particular positions. As a result, positions with fewer parts have fewer shop order instances to monitor or manage. In this manner, faster query of a shop order database for a particular position may be made when that database is for a position with fewer parts. After the selection of the position, an operator may select a section of aircraft for review.

Figure 9:
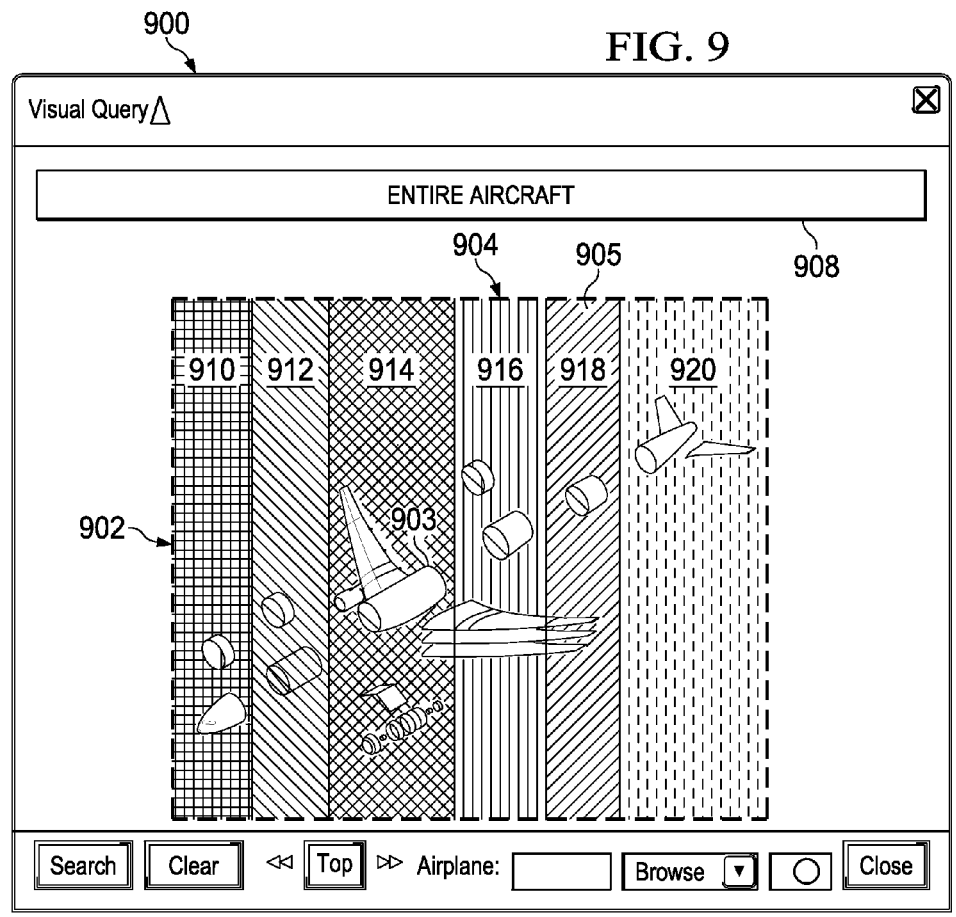
FIG. 9 is an illustration of a graphical user interface of aircraft sections in accordance with an illustrative embodiment.

Turning now to FIG. 9, an illustration of a graphical user interface of aircraft sections is depicted in accordance with an illustrative embodiment. In this illustrative example, graphical user interface 900 displays sections 902 for an aircraft in area 904 of graphical user interface 900.

As depicted, sectional view 905 is displayed in area 904 of graphical user interface 900. Sectional view 905 is an example of one implementation for sectional view 223 shown in block form in FIG. 2 and FIG. 3. In this particular example, sectional view 905 may be for an aircraft in position 812 in FIG. 8.

An operator may select a section from sections 902. As depicted, sections 902 are examples of sections 300 in FIG. 3 as displayed in graphical user interface 900. Sections 902 are selectable in this particular example. For example, section 903 in sections 902 is selectable by an operator in these illustrative examples. Section 903 is an upper barrel of an aircraft in this example.

With respect to selectability, sections 902 may include hotspots. These hotspots are not seen in this illustrative example. Hotspots are areas in graphical user interface 900 that may be selected to cause an action. In these illustrative examples, these hotspots correspond to sections 902. The hotspots may encompass sections 902 or may be around sections 902 or some combination thereof.

Additionally, an identification of the parts present in the section is also made in response to the user selection of a particular section. This identification may include any parts that are present for the particular position of the aircraft in that section. In other words, the same section of an aircraft in different positions may have different parts that are present based on tasks for installing parts. This identification may be made through the use of states 226 in FIG. 2.

In the illustrative example, an operator may select to view the entire aircraft by selecting the entire aircraft in entire aircraft area 908 in graphical user interface 900. In other words, the volume for display may be the entire aircraft. Further, an operator may select groups of sections 902. As depicted, the selection may be made by selecting one of area 910, area 912, area 914, area 916, area 918, and area 920 in graphical user interface 900 in FIG. 9. In these illustrative examples, these areas have hotspots. In this manner, an operator may view different portions of an aircraft in a manner that suits the particular query that the operator desires.

Figure 10:
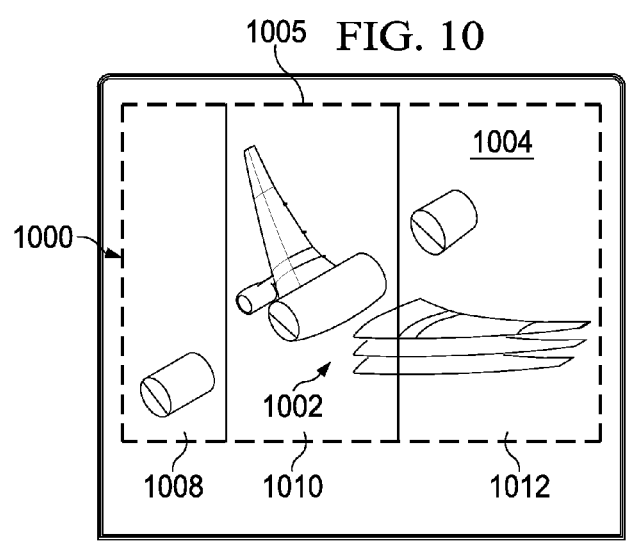
FIG. 10 is another illustration of a graphical user interface of aircraft sections in accordance with an illustrative embodiment.

Turning now to FIG. 10, another illustration of a graphical user interface of aircraft sections is depicted in accordance with an illustrative embodiment. In this illustrative example, graphical user interface 1000 displays sections 1002 for an aircraft in area 1004 of graphical user interface 1000.

As depicted, sectional view 1005 is displayed in area 1004 of graphical user interface 1000. Sectional view 1005 is an example of one implementation for sectional view 223 shown in block form in FIG. 2 and FIG. 3. In this particular example, sectional view 1005 may be for an aircraft in position 804 in FIG. 8.

In this illustrative example, only a portion of an aircraft is illustrated in the view of sections 1002 in sectional view 1005. As depicted, only sections 1002 that are present in a particular position are shown in this particular example.

Further, sections 1002 also may be selectable. The selectable ability of sections 1002 may be enabled through the use of hotspots associated with sections 1002. As a result, the selection of a particular section in sections 1002 may result in the display of the volume from a model of aircraft containing the selected section.

As depicted, area 1008, area 1010, and 1012 also are selectable. These areas group sections 1002. These areas may also have hotspots associated with them. The selection of one of these areas results in a volume containing the different sections within an area being displayed.

The illustration of graphical user interface 700 with buildings 702 in FIG. 7, graphical user interface 802 with aircraft positions 800 in FIG. 8, and graphical user interface 900 with sections 902 in FIG. 9, and graphical user interface 1000 with sections 1002 in FIG. 10 are examples of multi-level querying that may be performed in accordance with an illustrative embodiment. As depicted, the selection of a building from buildings 702 may select a particular model for an aircraft. The particular model may be displayed with positions using graphical user interface 802. The selection of a position may result in another view being displayed with sections 902 in graphical user interface 900 or sections 1002 in graphical user interface 1000. In this manner, an operator may more easily traverse models of different aircraft, depending on the position selected.

Figure 11:
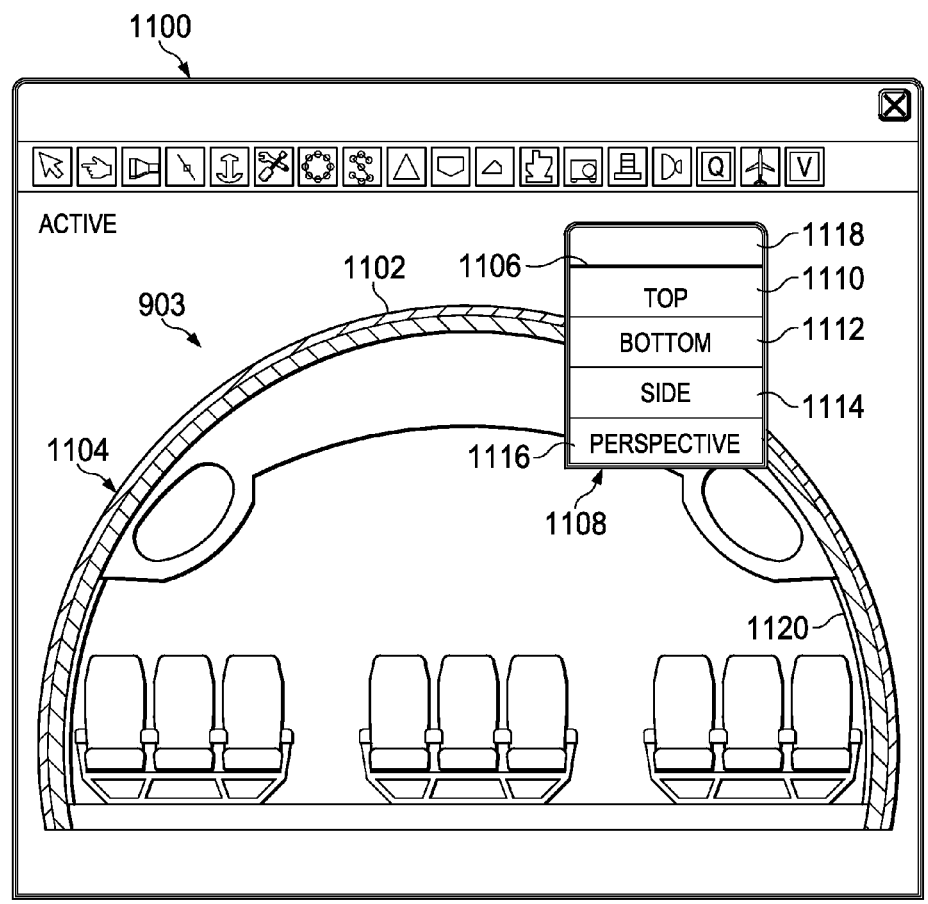
FIG. 11 is an illustration of a volume displayed in response to selection of a section in accordance with an illustrative embodiment.

In FIGS. 11-15, illustrations of a graphical user interface are shown in which nonconformances are identified. Turning first to FIG. 11, an illustration of a volume displayed in response to selection of a section is depicted in accordance with an illustrative embodiment. In this depicted example, graphical user interface 1100 displays graphical representations 1102 of parts 1104 in section 903 in FIG. 9. This view of section 903 is for the aircraft in position 808 in FIG. 8. As depicted, section 903 is an upper portion of the barrel for a fuselage of an aircraft.

As depicted, this view of section 903 may be initially based on a default point of view. This point of view may be set using point of view 408 in FIG. 4. From this view as displayed in graphical user interface 1100, an operator may traverse graphical representations 1102 of parts 1104 in section 903 to identify a nonconformance of the part within section 903.

An operator may traverse section 903 in a number of different ways. For example, an operator may select a graphical representation in graphical representations 1102 for a part in parts 1104 in section 903. The selection of the graphical representation for a part may provide a closer view of that part.

In another illustrative example, graphical representations 1102 of parts 1104 in section 903 may be traversed using commands 1106 displayed in menu 1108. In this illustrative example, commands 1106 include top 1110, bottom 1112, side 1114, and perspective 1116. Of course, these commands for different views are only examples and are not meant to encompass all the different types of commands that may be used to view graphical representations 1102 of particular parts in parts 1104. Commands such as zoom, pan, and other suitable commands also may be present in addition to or in place of the ones depicted in this illustrative example.

Additionally, in some cases, a part identifier may be entered into part field 1118. By entering a part identifier, different views of a particular part in parts 1104 may be seen by the operator. Additionally, the operator may also select a command for commands 1106 to provide a particular view of the part.

Of course, other processes may be used to traverse and view graphical representations 1102 of parts 1104 within section 903. These other processes may include those typically used with computer-aided design software and other types of software in which graphical representations 1102 of parts 1104 may be viewed and traversed.

In one illustrative example, an operator may traverse section 903 and view graphical representations 1102 of parts 1104 on interior wall 1120 of section 903. This view of interior wall 1120 may be performed to record a nonconformance on interior wall 1120.

Figure 12:
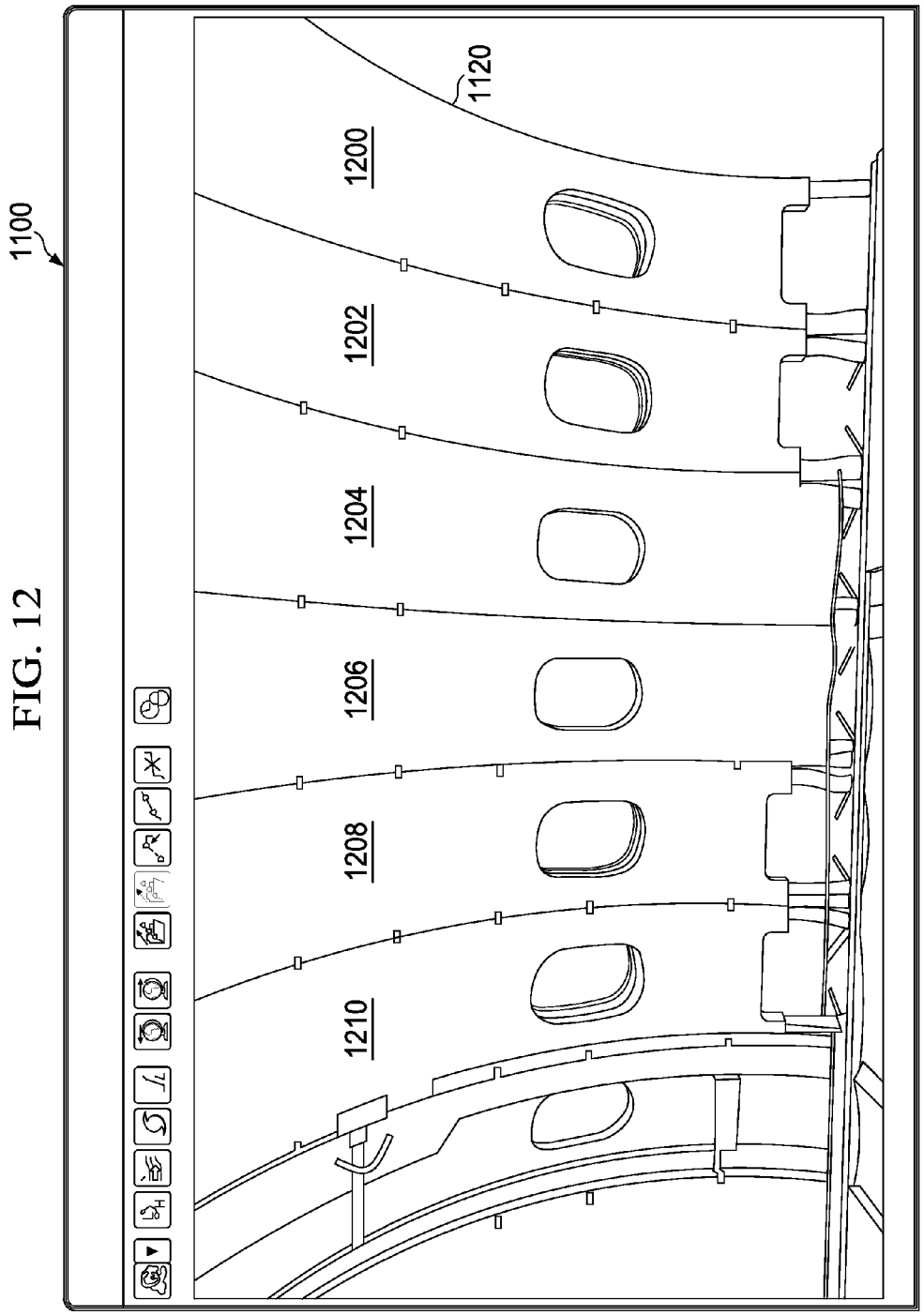
FIG. 12 is an illustration of an interior wall of a portion of a fuselage for an aircraft in accordance with an illustrative embodiment.

Turning now to FIG. 12, an illustration of an interior wall of a portion of a fuselage for an aircraft is depicted in accordance with an illustrative embodiment. In this illustration, a view of interior wall 1120 of section 903 for an upper barrel of a fuselage is shown in graphical user interface 1100.

As depicted, panel 1200, panel 1202, panel 1204, panel 1206, panel 1208, and panel 1210 are part of interior wall 1120 and are displayed as graphical representations 1102 of parts 1104 on interior wall 1120. In this illustrative example, nonconformances are located on panel 1204 and panel 1206.

Figure 13:
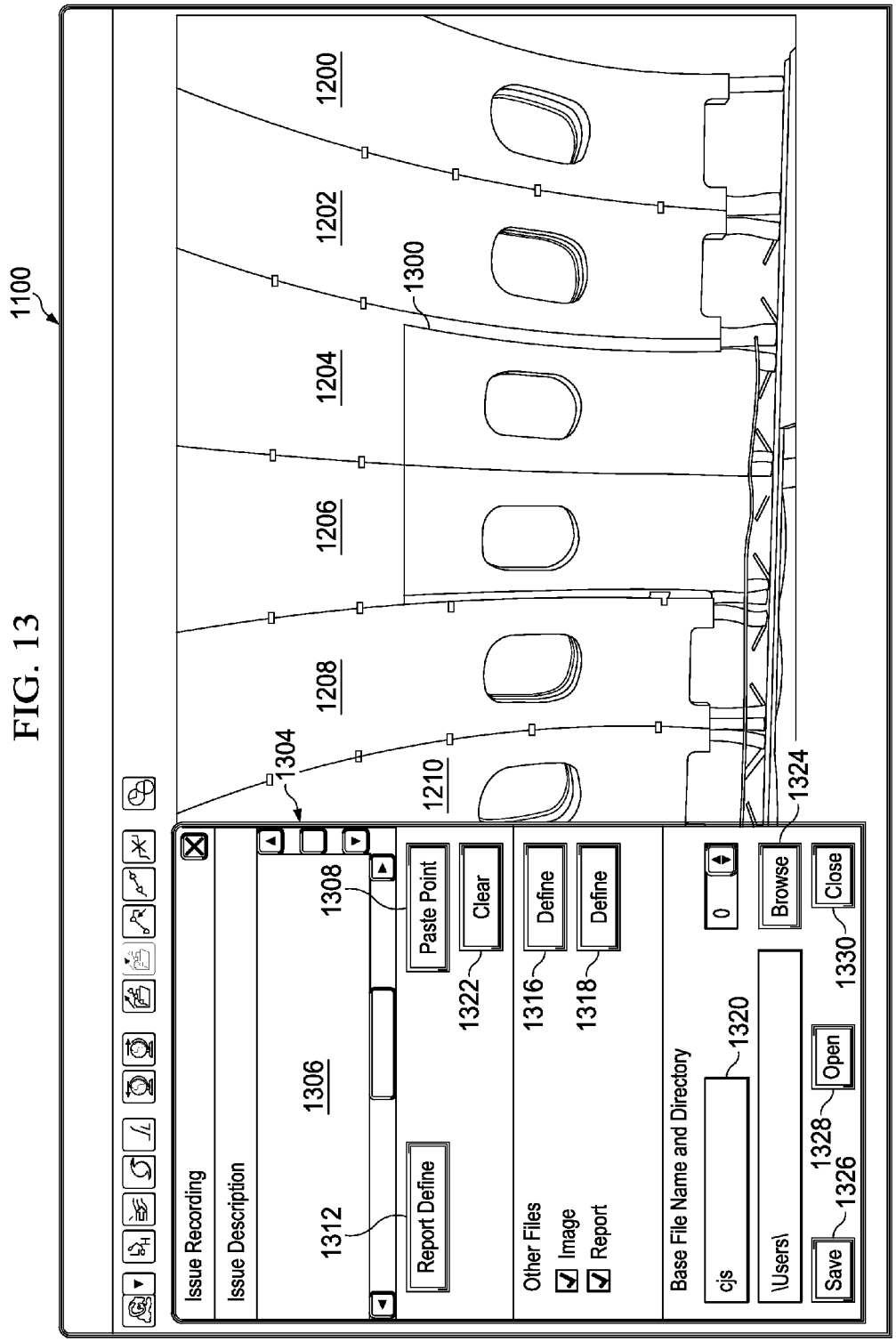
FIG. 13 is an illustration of a selection of parts for identifying a nonconformance in accordance with an illustrative embodiment.

Turning now to FIG. 13, an illustration of a selection of parts for identifying a nonconformance is depicted in accordance with an illustrative embodiment. In this illustrative example, the selection of panel 1204 and panel 1206 in graphical user interface 1100 results in an identification of a part with a nonconformance. Panel 1204 and panel 1206 are shown as being selected by highlight 1300. Highlight 1300 indicates that these panels have been identified as parts in which a nonconformance is present.

In this example, window 1304 is displayed in graphical user interface 1100. Window 1304 may be used to identify information about the nonconformances in panel 1204 and panel 1206.

As can be seen, window 1304 includes description field 1306 in which information about nonconformances may be entered. Description field 1306 may be used to enter information that may be located in details 616 in nonconformance record 600 in FIG. 6.

Paste point button 1308 may be used to enter coordinates using a selection of one or more graphical representations 1102 in nonconformance record 600.

These coordinates may be aircraft coordinates using a coordinate system based on a location in or relative to the aircraft. Aircraft coordinates may be entered through a selection of a part from the display of graphical representations 1102 of parts 1104 displayed in graphical user interface 1100. For example, a selection of panel 1206 may result in the coordinates for panel 1206 being recorded.

Report define button 1312 may be selected to define other information such as the different fields shown in nonconformance record 600 in FIG. 6. Other files may be attached to nonconformance record through the use of image define button 1316, report define button 1318, and file field 1320. File field 1320 may be used to locate files such as images, reports, and other files that may be included with the nonconformance record created using window 1304 when image define button 1316 or report define button 1318 is selected.

As illustrated, clear button 1322 in window 1304 may be used to clear information entered into window 1304. Browse button 1324 may be used to locate files that may be attached in the nonconformance record. Save button 1326 may save information entered into window 1304 to form a nonconformance record. Open button 1328 may be used to open a nonconformance record for editing. Close button 1330 may be used to close window 1304.

The illustration of the configuration of window 1304 is not meant to limit the manner in which information may be received to create or edit a nonconformance record. Other fields, controls, or elements may be used to enter information into window 1304. For example, a field may be present to enter a name of the operator creating the nonconformance record. In some illustrative examples, some fields may be absent from the ones shown in window 1304. For example, one or both of image define button 1316 and report define button 1318 may be omitted.

In the illustrative examples, parts may cover other parts in graphical representations 1102 of parts 1104. In other words, additional parts may be hidden by graphical representations 1102 of parts 1104 displayed in graphical user interface 1100. In these illustrative examples, parts may be removed to display graphical representations of other parts not shown in this view. For example, panel 1204 and panel 1206 may be removed to display graphical representations of additional parts not shown in this view.

Figure 14:
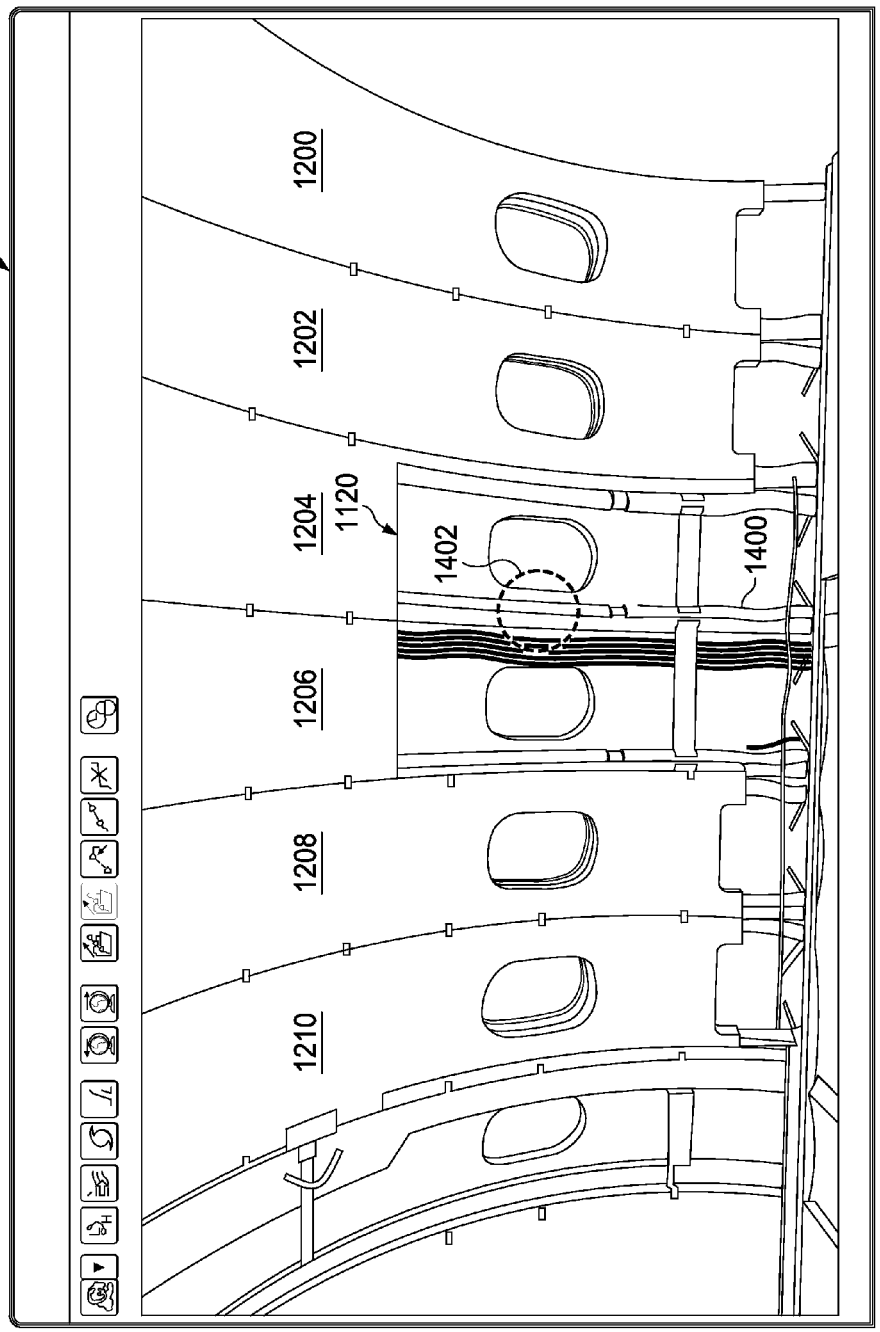
FIG. 14 is an illustration of a support structure with nonconformances in accordance with an illustrative embodiment.

With reference now to FIG. 14, an illustration of a support structure with nonconformances is depicted in accordance with an illustrative embodiment. As depicted, panel 1204 and panel 1206 in graphical user interface 1100 have been removed from the graphical representations 1102 of parts 1104 to reveal support structure 1400. In this illustrative example, area 1402 may be selected for recording a nonconformance.

Figure 15:
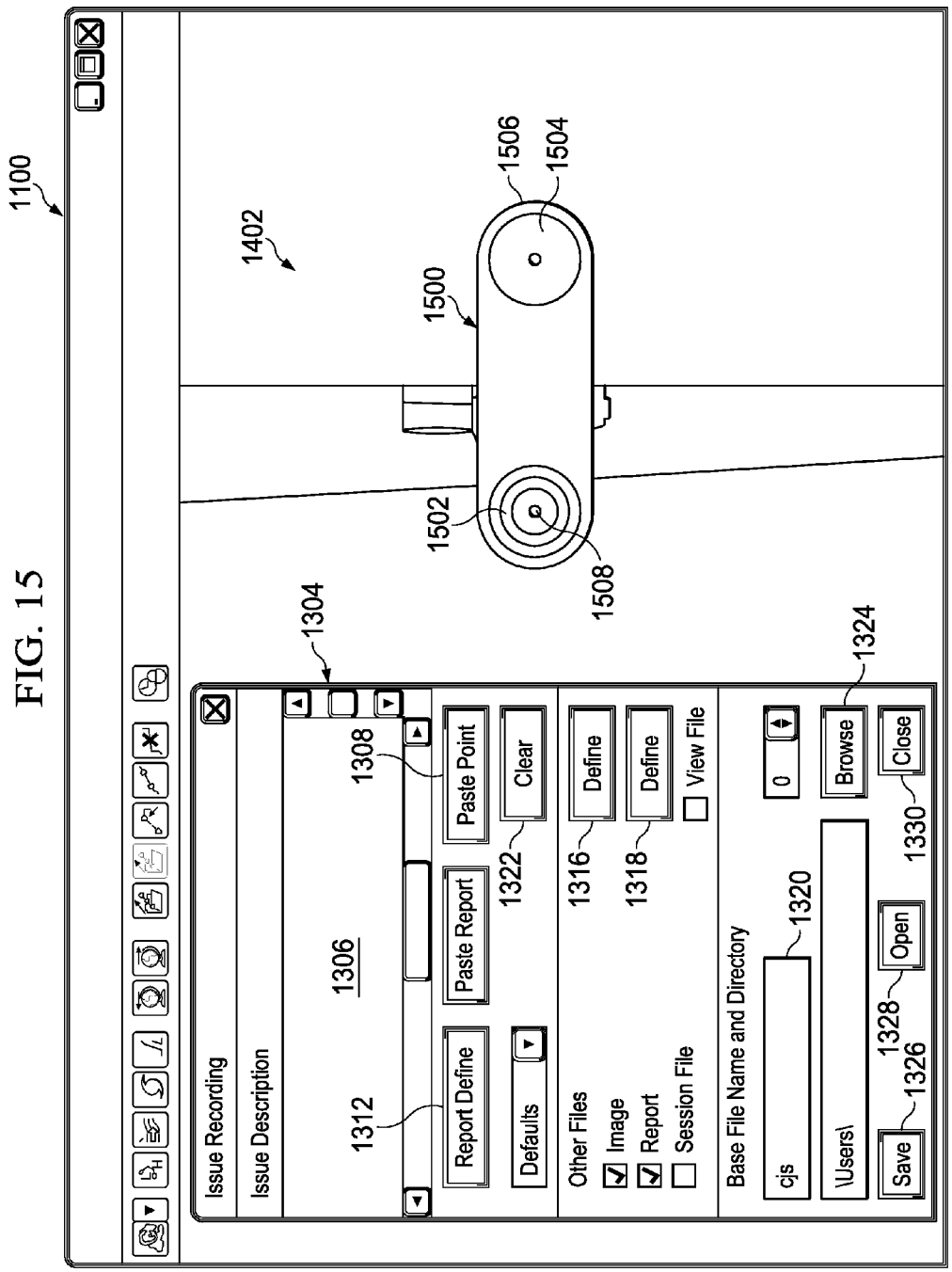
FIG. 15 is an illustration of an enlarged view of an area in accordance with an illustrative embodiment.

With reference now to FIG. 15, an illustration of an enlarged view of an area is depicted in accordance with an illustrative embodiment. In this depicted example, an enlarged view of area 1402 is shown in graphical user interface 1100.

In this example, a component in the form of clip 1500 is shown with hole 1502 and hole 1504. The selection of clip 1500 results in highlighting 1506 of clip 1500. Highlighting 1506 indicates that this part has been selected for recording the presence of a nonconformance in the part.

In this illustrative example, hole 1502 has nonconformance. Nonconformance is the location of hole 1502. In this illustrative example, window 1304 is displayed again in graphical user interface 1100 for use in recording the nonconformance of hole 1502. In this illustrative example, window 1304 may be used to identify the location of hole 1502. This identification may be used through the use of paste point button 1308. For example, the operator may select point 1508 and then paste point 1508 using paste point button 1308. The coordinates of hole 1502 may be identified by selecting a point including hole 1502 in the graphical representation of hole 1502. This selection results in an identification of the aircraft coordinate for hole 1502 being made in this illustrative example.

These operations result in the coordinates for the location of point 1508 being recorded. The identification of these coordinates may be performed without the operator needing to know how to identify the coordinates. The identification of these coordinates occurs through the selection of point 1508.

The illustrations of the different graphical user interfaces in FIGS. 7-15 are provided only as examples of some implementations for graphical user interface 208 in FIG. 2. These examples are not meant to limit the manner in which an illustrative embodiment may be implemented. For example, although the different examples are displayed with reference to aircraft, similar displays may be used for other types of vehicles or objects. For example, the graphical user interfaces may be configured for sections of objects such as an automobile, a ship, a satellite, an engine, or some other suitable type of object.

As another illustrative example, the display of the different graphical user interfaces may be performed using other graphical user interfaces in addition to or in place of the ones depicted. Further, the order of the graphical user interfaces may vary from the order described above.

Figure 16:
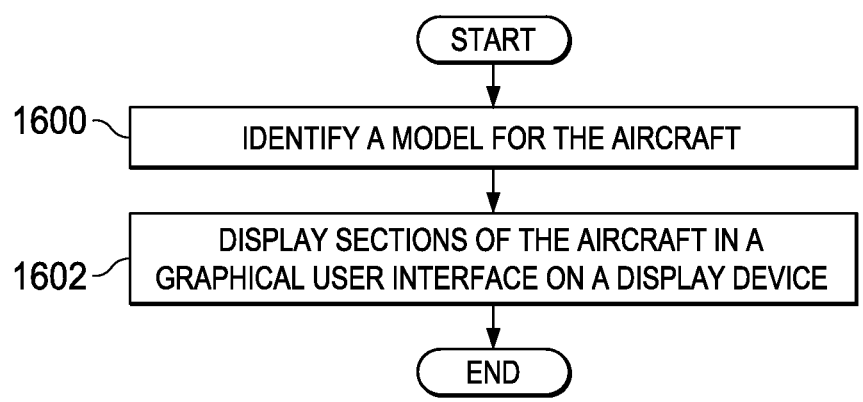
FIG. 16 an illustration of a flowchart of a process to visually query an object in accordance with an illustrative embodiment.

With reference next to FIG. 16, an illustration of a flowchart of a process to visually query an object is depicted in accordance with an illustrative embodiment. In this illustrative example, the method may be used to visually query an object such as an aircraft. The process may be implemented using object manager 124 in FIG. 1. In particular, one or more of the different components for object manager 124 illustrated in FIG. 2 may be used to visually query an aircraft.

The process begins by identifying a model for the aircraft (operation 1600). In the illustrative examples, a model for the aircraft may be identified in a number of ways as described above. For example, a model may be identified by selecting the model from a list of models. In other illustrative examples, the model may be identified visually using a graphical user interface such as graphical user interface 700 in FIG. 7.

The process then displays sections of the aircraft in a graphical user interface on a display device (operation 1602), with the process terminating thereafter. The sections correspond to sections manufactured for assembly of aircraft. Further, the sections also are selectable in the illustrative examples. The ability to select these sections may be provided through various mechanisms. In this illustrative example, the selectability may be provided through hotspots associated with the sections that are displayed in the graphical user interface. Further, the sections are displayed in an exploded view in operation 1602.

Figure 17:
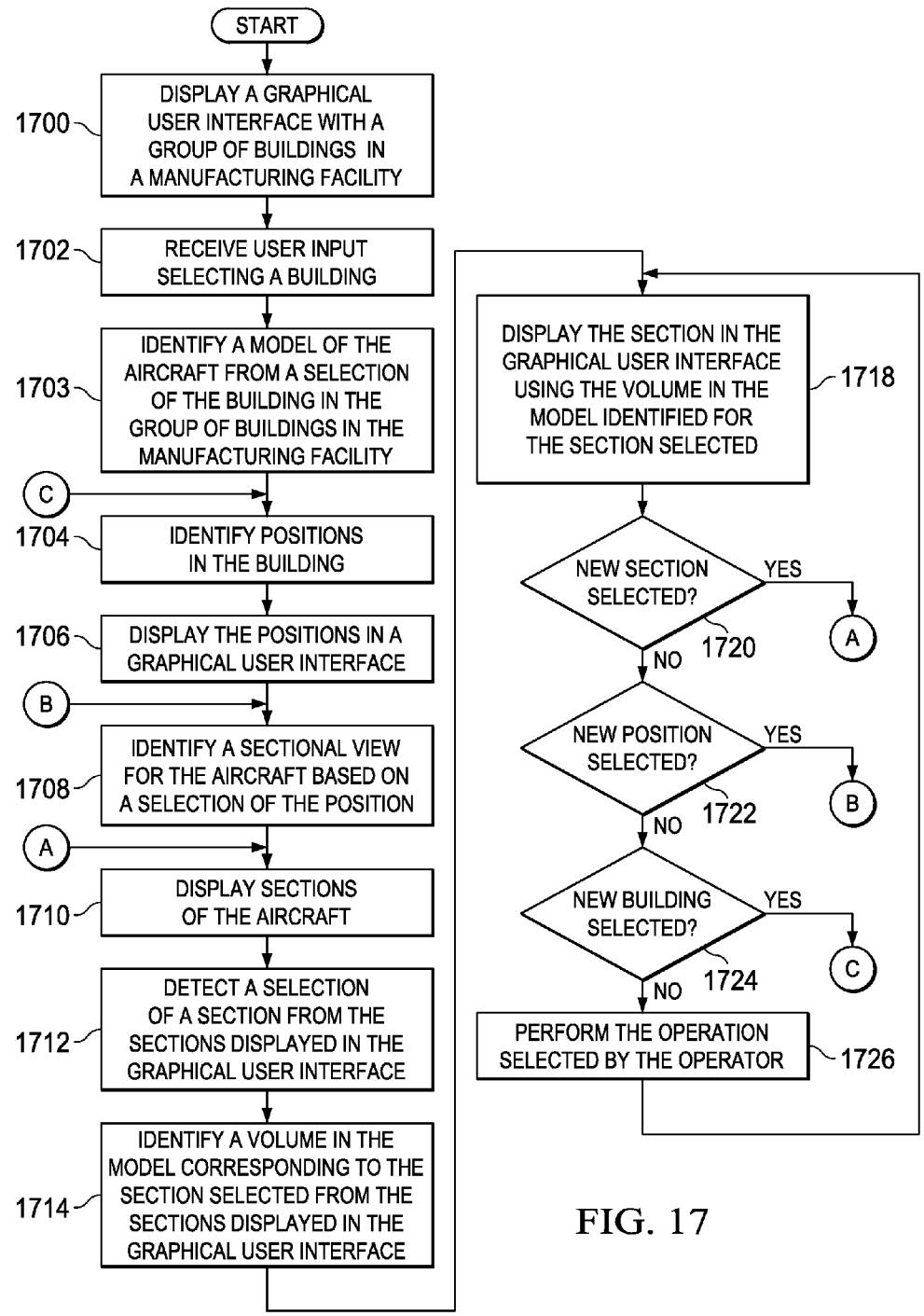
FIG. 17 an illustration of a flowchart of a process for visually querying an aircraft in accordance with an illustrative embodiment.

Turning now to FIG. 17, an illustration of a flowchart of a process for visually querying an aircraft is depicted in accordance with an illustrative embodiment. This process is an example of one manner in which an operator may visually view different parts of an aircraft without needing to know coordinates for the different locations in which the parts are located. The different operations illustrated in FIG. 17 may be implemented using object visualizer 204 in FIG. 2.

The process begins by displaying a graphical user interface with a group of buildings in a manufacturing facility (operation 1700). The graphical user interface includes hotspots for the buildings that can be selected. A hotspot is a portion of the graphical user interface that may be selected to cause an action. In these illustrative examples, the buildings are hotspots that may be selected by an operator.

The process then receives user input selecting a building (operation 1702). In this illustrative example, each building may be used to assemble a particular aircraft. The particular aircraft may be a particular type of aircraft such as the model. In some cases, more than one building may be used to assemble the same type of aircraft but the particular aircraft may be a specific build for a customer with specific options. In other words, different aircraft of the same type may be assembled in different buildings that have different options although they are of the same type.

Next, a model of the aircraft is identified from a selection of the building in the group of buildings in the manufacturing facility (operation 1703). Positions in the building are identified (operation 1704). Each building may have different positions for the aircraft that are being assembled. Further, even if a building has the same positions, the status of an aircraft at a particular building at particular positions may be different from other buildings. Further, even with the same positions, different aircraft may be assembled in the positions in different buildings.

The positions are displayed in a graphical user interface (operation 1706). In these illustrative examples, the different positions are hotspots that may be selected through user input entered by an operator. The process then receives user input for selecting a position.

The process then identifies a sectional view for the aircraft based on a selection of a position (operation 1708). In this illustrative example, each position may have a different sectional view that may be displayed. The sections of aircraft in a position are the sections manufactured at the position selected in these illustrative examples. The sectional view includes sections for that particular position.

As depicted, the sectional view may be, for example, sectional view 223 in sectional views 224 in FIG. 2. Different sectional views are present for different positions in the illustrative example. Sectional view 905 in FIG. 9 and sectional view 1005 in FIG. 10 are examples of sectional views that may be selected depending on the position selected for the aircraft in operation 1708.

In these illustrative examples, the sectional views were selected for parts that are present in the aircraft for the position. These are parts that may already be present from assembly of the aircraft in a prior position or may be parts that are to be assembled in the position selected.

The process then displays sections of the aircraft (operation 1710). In operation 1710, the sections are displayed in the sectional view of the aircraft. Further, the different sections are displayed in association with hotspots that may be selected by user input entered by an operator. The process then detects a selection of a section from the sections displayed in the graphical user interface (operation 1712). In operation 1712, the section has hotspots associated with the volume identifier. The selection of a section of an aircraft involves selecting the hotspot associated with the aircraft. The hotspot points to a volume identifier, such as volume identifier 222 in FIG. 2. In some cases, the hotspot may be a link pointing to the volume identifier. For example, the hotspot may be an index used to identify a volume identifier.

The process then identifies a volume in the model corresponding to the section selected from the sections displayed in the graphical user interface (operation 1714). In these illustrative examples, each section of an aircraft is associated with the volume for the aircraft. This volume is identified from volume identifiers associated with sections in the sectional view using the volume identifier pointed to by the hotspot selected for the section. The volume identifier may include information defining the volume. For example, volume identifier 222 may include volume descriptor 402 as depicted in FIG. 4. In particular, the identifier may include a group of coordinates defining the volume in the model.

The process then displays the section in the graphical user interface using the volume in the model identified for the section selected (operation 1718). Next, a determination is made as to whether a new section of the aircraft has been selected for the position of the aircraft (operation 1720). If any section has been selected, the process then returns to operation 1710 as described above.

If a new section has not been selected, a determination is made as to whether a new position has been selected for the aircraft (operation 1722). If a new position has been selected, the process then returns to operation 1708 as described above. If a new position has not been selected, the process determines whether a new building has been selected (operation 1724). If a new building has been selected, the process returns to operation 1704. Otherwise, the process performs the operation selected by the operator (operation 1726) with the process then returning to operation 1718. In operation 1726, the operator may rotate the parts displayed in the volume, magnify the display, remove parts, annotate parts, or perform other operations with respect to the parts displayed in the volume.

Figure 18:
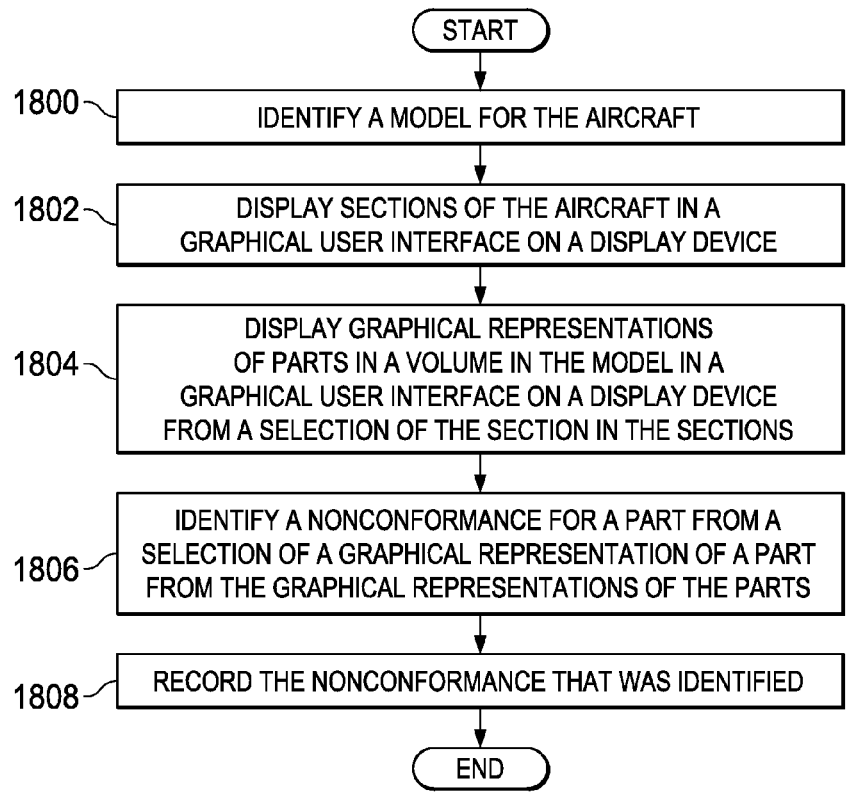
FIG. 18 is an illustration of a flowchart of a process for recording a nonconformance in accordance with an illustrative embodiment.

Turning now to FIG. 18, an illustration of a flowchart of a process for recording a nonconformance is depicted in accordance with an illustrative embodiment. In this depicted example, the process illustrated in FIG. 18 may be used to record a nonconformance and an object, such as an aircraft. This process may be implemented within nonconformance visualization system 138 in object manager 124 in FIG. 1. In particular, these operations may be implemented in nonconformance recorder 240 in FIG. 2.

The process begins by identifying a model for the aircraft (operation 1800). The process then displays sections of the aircraft in a graphical user interface on a display device (operation 1802). In the illustrative examples, the sections correspond to sections as manufactured for assembly of the aircraft and wherein the sections are selectable. In other illustrative examples, the sections may be defined in other ways.

The process then displays graphical representations of parts in a volume in the model in a graphical user interface on a display device from a selection of the section in the sections (operation 1804). In operation 1804, the volume corresponds to a location of the nonconformance in the aircraft. The process identifies a nonconformance for a part from a selection of a graphical representation of a part from the graphical representations of the parts (operation 1806). In operation 1806, the selection of the part results in the display of a window to record information about the nonconformance. This window may be, for example, window 1304 in FIG. 13. Of course any construct may be used to enter information about a nonconformance that has been identified. In the illustrative examples, identifying the nonconformance of the part in the aircraft may be performed prior to identifying the nonconformance for the part from the selection of the graphical representation of the part from the graphical representations of the parts in operation 1806.

The process then records the nonconformance that was identified (operation 1808). The process terminates thereafter.

Figure 19:
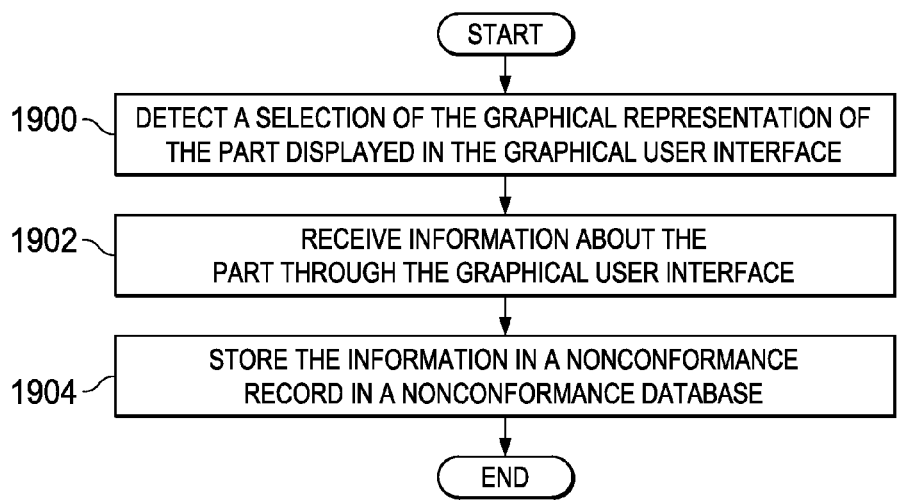
FIG. 19 is an illustration of a flowchart of a process for recording a nonconformance in accordance with an illustrative embodiment.

Turning now to FIG. 19, an illustration of a flowchart of a process for recording a nonconformance is depicted in accordance with an illustrative embodiment. The process illustrated in FIG. 19 is an example of one implementation for operation 1808 in FIG. 18.

The process begins by detecting a selection of the graphical representation of the part displayed in the graphical user interface (operation 1900). The process then receives information about the part through the graphical user interface (operation 1902).

In operation 1902, the information about the nonconformance may be entered through the entry of information by an operator in a window displayed in a graphical user interface. This graphical user interface may be displayed in a data processing system. The data processing system may be selected from one of a tablet computer, a mobile phone, a laptop computer, a desktop computer, or other suitable computing device. In these illustrative examples, information is received from a data processing system located in a location that is selected from one of inside of the aircraft and outside of the aircraft.

For example, the information may be entered in the data processing system while an operator is in the aircraft performing the inspection identifying the nonconformance. In other illustrative examples, this operation may be performed by an operator entering information in the data processing system at another location after the inspection has been performed. The other location may be outside of the aircraft, at another building, or some other suitable location.

The process then stores the information in a nonconformance record in a nonconformance database (operation 1904) with the process terminating thereafter. The storing of information may be within nonconformance records 244 in nonconformance database 242 in FIG. 2. The record may be, for example, nonconformance record 600 in FIG. 6.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams. When implemented as a combination of program code and hardware, the implementation may take the form of firmware.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

In one illustrative example, sections may not be displayed in an exploded view in operation 1702 in FIG. 17. Instead, the sections may be displayed as a whole aircraft in which different sections may be selected through hotspots. The different sections may be indicated using lines or other graphical indicators in this type of implementation.

Figure 20:
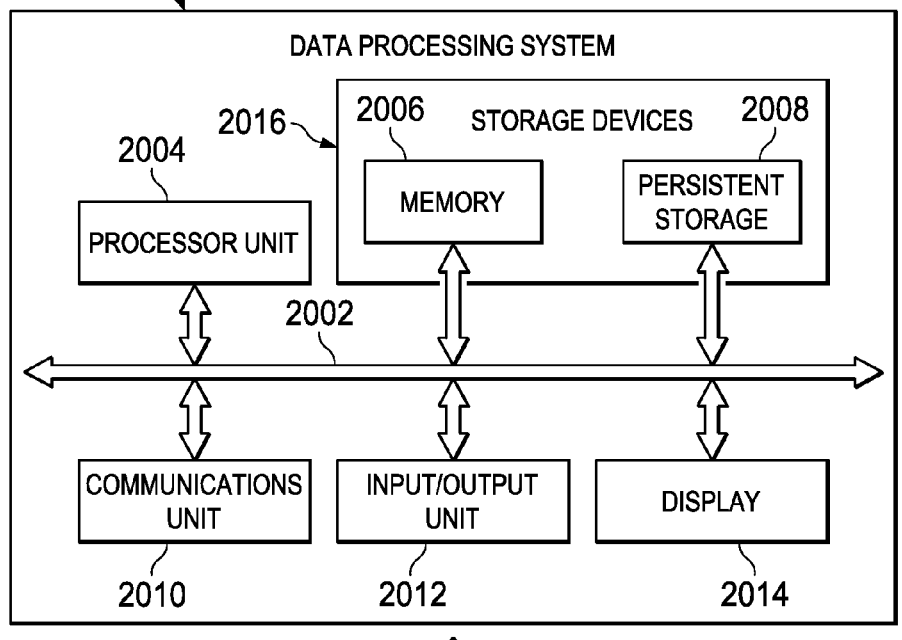
FIG. 20 an illustration of a block diagram of a data processing system in accordance with an illustrative embodiment.

Turning now to FIG. 20, an illustration of a block diagram of a data processing system is depicted in accordance with an illustrative embodiment. Data processing system 2000 may be used to implement computer system 126 in FIG. 1. In this illustrative example, data processing system 2000 includes communications framework 2002, which provides communications between processor unit 2004, memory 2006, persistent storage 2008, communications unit 2010, input/output unit 2012, and display 2014. In this example, communications framework may take the form of a bus system.

Processor unit 2004 serves to execute instructions for software that may be loaded into memory 2006. Processor unit 2004 may be a number of processors, a multi-processor core, or some other type of processor, depending on the particular implementation.

Memory 2006 and persistent storage 2008 are examples of storage devices 2016. A storage device is any piece of hardware that is capable of storing information, such as, for example, without limitation, data, program code in functional form, and/or other suitable information either on a temporary basis and/or a permanent basis. Storage devices 2016 may also be referred to as computer readable storage devices in these illustrative examples. Memory 2006, in these examples, may be, for example, a random access memory or any other suitable volatile or non-volatile storage device. Persistent storage 2008 may take various forms, depending on the particular implementation.

For example, persistent storage 2008 may contain one or more components or devices. For example, persistent storage 2008 may be a hard drive, a flash memory, a rewritable optical disk, a rewritable magnetic tape, or some combination of the above. The media used by persistent storage 2008 also may be removable. For example, a removable hard drive may be used for persistent storage 2008.

Communications unit 2010, in these illustrative examples, provides for communications with other data processing systems or devices. In these illustrative examples, communications unit 2010 is a network interface card.

Input/output unit 2012 allows for input and output of data with other devices that may be connected to data processing system 2000. For example, input/output unit 2012 may provide a connection for user input through a keyboard, a mouse, and/or some other suitable input device. Further, input/output unit 2012 may send output to a printer. Display 2014 provides a mechanism to display information to a user.

Instructions for the operating system, applications, and/or programs may be located in storage devices 2016, which are in communication with processor unit 2004 through communications framework 2002. The processes of the different embodiments may be performed by processor unit 2004 using computer-implemented instructions, which may be located in a memory, such as memory 2006.

These instructions are referred to as program code, computer usable program code, or computer readable program code that may be read and executed by a processor in processor unit 2004. The program code in the different embodiments may be embodied on different physical or computer readable storage media, such as memory 2006 or persistent storage 2008.

Program code 2018 is located in a functional form on computer readable media 2020 that is selectively removable and may be loaded onto or transferred to data processing system 2000 for execution by processor unit 2004. Program code 2018 and computer readable media 2020 form computer program product 2022 in these illustrative examples. In one example, computer readable media 2020 may be computer readable storage media 2024 or computer readable signal media 2026. In these illustrative examples, computer readable storage media 2024 is a physical or tangible storage device used to store program code 2018 rather than a medium that propagates or transmits program code 2018.

Alternatively, program code 2018 may be transferred to data processing system 2000 using computer readable signal media 2026. Computer readable signal media 2026 may be, for example, a propagated data signal containing program code 2018. For example, computer readable signal media 2026 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 2000 are not meant to provide architectural limitations to the manner in which different embodiments may be implemented. The different illustrative embodiments may be implemented in a data processing system including components in addition to and/or in place of those illustrated for data processing system 2000. Other components shown in FIG. 20 can be varied from the illustrative examples shown. The different embodiments may be implemented using any hardware device or system capable of running program code 2018.

Illustrative embodiments of the disclosure may be described in the context of aircraft manufacturing and service method 2100 as shown in FIG. 21 and aircraft 2200 as shown in FIG. 22. Turning first to FIG. 21, an illustration of an aircraft manufacturing and service method is depicted in accordance with an illustrative embodiment. During pre-production, aircraft manufacturing and service method 2100 may include specification and design 2102 of aircraft 2200 in FIG. 22 and material procurement 2104.

During production, component and subassembly manufacturing 2106 and system integration 2108 of aircraft 2200 in FIG. 22 takes place. Thereafter, aircraft 2200 in FIG. 22 may go through certification and delivery 2110 in order to be placed in service 2112. While in service 2112 by a customer, aircraft 2200 in FIG. 22 is scheduled for routine maintenance and service 2114, which may include modification, reconfiguration, refurbishment, and other maintenance or service.

Each of the processes of aircraft manufacturing and service method 2100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 22, an illustration of a block diagram of an aircraft is depicted in which an illustrative embodiment may be implemented. In this example, aircraft 2200 is produced by aircraft manufacturing and service method 2100 in FIG. 21 and may include airframe 2202 with systems 2204 and interior 2206. Examples of systems 2204 include one or more of propulsion system 2208, electrical system 2210, hydraulic system 2212, and environmental system 2214. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 2100 in FIG. 21. For example, one or more illustrative embodiments may be implemented during system integration 2108. The different illustrative examples may be implemented to identify information to perform tasks to assemble parts on aircraft 2200.

In particular, the visual query of aircraft may be used to identify locations where tasks for shop order instances are to be performed or where tasks have been performed. Additionally, an illustrative embodiment also may be implemented during maintenance and service 2114. For example, information about the aircraft may be visually queried and viewed by an operator to perform tasks to assemble parts for maintenance, upgrades, refurbishment, and other operations during maintenance and service 2114 may be identified using an illustrative embodiment.

Figure 23:
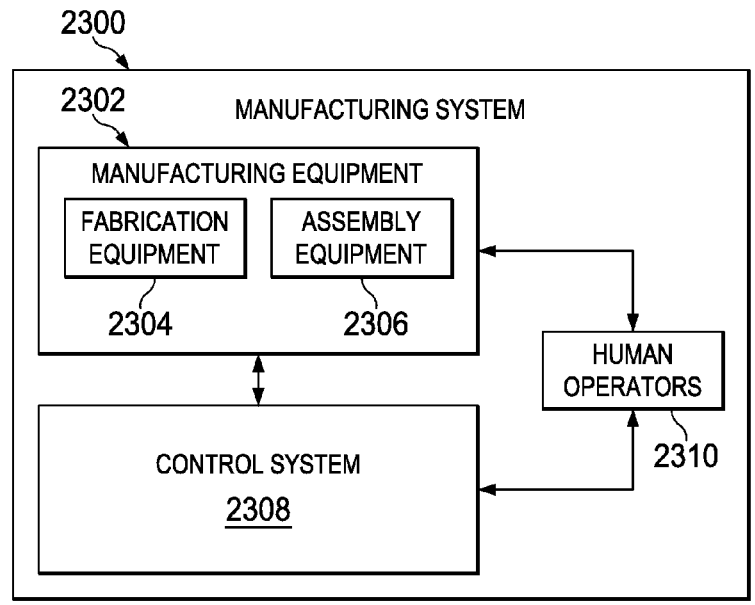
FIG. 23 is an illustration of a block diagram of a manufacturing system in accordance with an illustrative embodiment.

Turning now to FIG. 23, an illustration of a block diagram of a manufacturing system is depicted in accordance with an illustrative embodiment. Manufacturing system 2300 is a physical hardware system and is configured to manufacture products, such as aircraft 2200 in FIG. 22.

As depicted, manufacturing system 2300 includes manufacturing equipment 2302. Manufacturing equipment 2302 includes at least one of fabrication equipment 2304 or assembly equipment 2306.

Fabrication equipment 2304 is equipment that may be used to fabricate components for parts used to form aircraft 2200. For example, fabrication equipment 2304 may include machines and tools. These machines and tools may be at least one of a drill, a hydraulic press, a furnace, a mold, a composite tape laying machine, a vacuum system, a lathe, or other suitable types of equipment. Fabrication equipment 2304 may be used to fabricate at least one of metal parts, composite parts, semiconductors, circuits, fasteners, ribs, skin panels, spars, antennas, pharynx, or other suitable types of parts.

Assembly equipment 2306 is equipment used to assemble parts to form aircraft 2200. In particular, assembly equipment 2306 may be used to assemble components and parts to form aircraft 2200. Assembly equipment 2306 also may include machines and tools. These machines and tools may be at least one of a robotic arm, a crawler, a faster installation system, a rail-based drilling system, or a robot. Assembly equipment 2306 may be used to assemble parts such as seats, horizontal stabilizers, wings, engines, engine housings, landing gear systems, and other parts for aircraft 2200.

Manufacturing system 2300 also includes control system 2308. Control system 2308 is a hardware system and may also include software or other types of components. Control system 2308 is configured to control the operation of manufacturing equipment 2302. Control system 2308 may be implemented using hardware. The hardware may include computers, circuits, networks, and other types of equipment. The control may take the form of direct control of manufacturing equipment 2302. For example, robots, computer-controlled machines, and other equipment may be controlled by control system 2308. In other illustrative examples, control system 2308 may managing operations performed by human operators 2310 in manufacturing aircraft 2200.

In these illustrative examples, object manager 124 in FIG. 1 may be implemented in control system 2308 to manage the manufacturing of aircraft 2200 in FIG. 22.

In the different illustrative examples, human operators 2310 may operate or interact with at least one of manufacturing equipment 2302 or control system 2308. This interaction may be performed to manufacture aircraft 2200.

Of course, manufacturing system 2300 may be configured to manufacture other products. Although manufacturing system 2300 has been described with respect to manufacturing in the aerospace industry, manufacturing system 2300 may be configured to manufacture products for other industries. For example, manufacturing system 2300 may be configured to manufacture products for the automotive industry as well as any other suitable industries.

Figure 24:
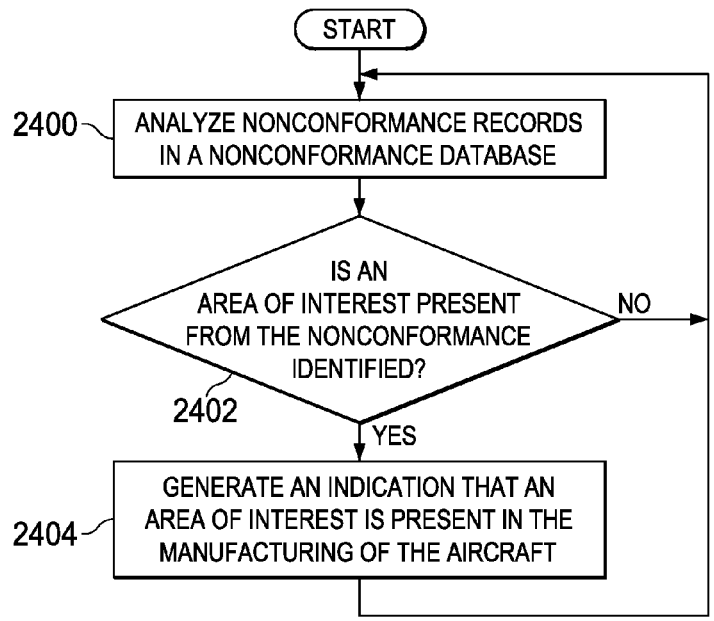
FIG. 24 is an illustration of a flowchart of a process for managing the manufacturing of an aircraft in accordance with an illustrative embodiment.

Turning now to FIG. 24, an illustration of a flowchart of a process for managing the manufacturing of an aircraft is depicted in accordance with an illustrative embodiment. The process illustrated in FIG. 24 may be implemented in control system 2308 in FIG. 23. This process may be used to determine whether changes need to be made to the manufacturing of an aircraft.

The process begins by analyzing nonconformance records in a nonconformance database (operation 2400). For example, the analysis may be made of nonconformance records 244 in nonconformance database 242 in FIG. 2.

A determination is made as to whether an area of interest is present from the nonconformances identified (operation 2402). If a large cluster of nonconformances are present in a particular area or position in the assembly line, an area of interest may be identified. An area of interest may also be present when the number of nonconformances are greater than desired. The area of interest may be, for example, an area in the aircraft, a position in the assembly line, or some other suitable type of area.

If an area of interest is identified, the process generates an indication that an area of interest is present in the manufacturing of the aircraft (operation 2404) with the process then returning to operation 2400. The records in the nonconformance database may be updated or changed as the process returns to operation 2400.

This indication may be used to make changes in the manufacturing of aircraft 2200. These changes may include at least one of changing a design, changing an assembly process, selecting a new vendor, or some other suitable change that may reduce the occurrence of nonconformances in the manufacturing of aircraft.

The process also returns to operation 2400 if an area of interest is not identified from the nonconformances identified in operation 2402. The process may continue to loop back until the process is terminated.

In this manner, operators may visualize information about an aircraft using a graphical user interface. This visualization may be performed on the shop floor by operators who may not have experience and training with computer-aided design software. This visual query allows an operator to visually look at an aircraft or other object.

The visualization may be performed without operators having to know coordinates for locations in the aircraft. In these illustrative examples, the graphical user interface displays graphical representations of the aircraft that allows the operators to view different portions of the aircraft without using coordinates to traverse the views of the aircraft.

With the visualization of the aircraft, the identification and recording of nonconformances in an aircraft may be made more easily by operators. In the illustrative examples, an operator may visually indicate the presence of a nonconformance by selecting a graphical representation of the part in which a nonconformance has been identified. Additionally, the process may automatically identify coordinates of the location of the nonconformance based on the selection of the graphical representation of the parts displayed in a graphical user interface. In other words, the operator does not need to identify airplane coordinates or other information about the location of the nonconformance. As a result, the recording of nonconformances may be performed with less time and effort as compared to currently used techniques.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for recording a nonconformance in an aircraft, the method comprising:
   identifying a model for the aircraft;
   displaying sections of the aircraft in a graphical user interface on a display device, wherein the sections correspond to sections as manufactured for assembly of the aircraft and wherein the sections are selectable;
   identifying a location of a nonconformance of a part in the aircraft;
   displaying graphical representations of parts in a volume in the model in the graphical user interface on the display device from a selection of a section in the sections, wherein the volume corresponds to the location of the nonconformance in the aircraft;
   identifying the nonconformance for a part from a selection of a graphical representation of the part from the graphical representations of the parts, wherein the nonconformance of the part in the aircraft is identified prior to the identification of the part from the selection of the graphical representation of the part from the graphical representation of parts; and
   recording the nonconformance that was identified.

2. The method of claim 1, wherein identifying the nonconformance for the part from the selection of the graphical representation of the part from the graphical representations of the parts comprises:
   detecting the selection of the graphical representation of the part displayed in the graphical user interface; and
   receiving information about the part through the graphical user interface.

3. The method of claim 2, wherein the information is received from a data processing system located in a location that is selected from one of inside of the aircraft and outside of the aircraft.

4. The method of claim 2, wherein the information is received from a data processing system selected from one of a tablet computer, a mobile phone, a laptop computer, and a desktop computer.

5. The method of claim 1 further comprising:
   determining whether an area of interest is present from nonconformances that have been recorded.

6. The method of claim 1, wherein identifying the model for the aircraft comprises:
   displaying buildings in which assembly occurs, wherein the buildings are associated with models; and
   identifying the model from a selection of a building in the buildings.

7. The method of claim 1, wherein the sections are associated with hotspots.

8. The method of claim 1 further comprising:
   managing assembly of the aircraft based on nonconformances that have been recorded.

9. A method for recording a nonconformance in an object, the method comprising:
   displaying sections of the object in a graphical user interface on a display device, wherein the sections correspond to sections as manufactured for assembly of the object and wherein the sections are selectable;
   identifying a location of a nonconformance in the object;

displaying graphical representations of parts in a volume in a model of the object in the graphical user interface on the display device from a selection of a section in the sections, wherein the volume corresponds to the location of the nonconformance in the object;

identifying the nonconformance for a part from a selection of a graphical representation of the part from the graphical representations of the parts in response to the identification of the location of the nonconformance in the object, wherein the nonconformance of the part in the object is identified prior to the identification of the part from the selection of the graphical representation of the part from the graphical representation of parts; and storing the nonconformance that was identified.

10. The method of claim 9, wherein identifying the nonconformance for the part from the selection of the graphical representation of the part from the graphical representations of the parts comprises:

detecting the selection of the graphical representation of the part displayed in the graphical user interface; and receiving information about the part through the graphical user interface.

11. An apparatus comprising:
an object manager configured to:
identify a model for an aircraft;
display sections of the aircraft in a graphical user interface on a display device, wherein the sections correspond to sections as manufactured for assembly of the aircraft, and wherein the sections are selectable;
identify a location of a nonconformance in the aircraft;
display graphical representations of parts in a volume in the model in the graphical user interface on the display device from a selection of a section in the sections, wherein the volume corresponds to a location of nonconformance in the aircraft;
identify the nonconformance for a part from a selection of a graphical representation of the part from the graphical representations of the parts, wherein the nonconformance of the part in the aircraft is identified prior to the identification of the part from the selection of the graphical representation of the part from the graphical representation of parts; and
store the nonconformance that was identified.

12. The apparatus of claim 11, wherein in being configured to identify the nonconformance for the part from the selection of the graphical representation of the part from the graphical representations of the parts, the object manager is configured to detect the selection of the graphical representation of the part displayed in the graphical user interface and receive information about the part through the graphical user interface.

13. The apparatus of claim 12, wherein the information is received from a data processing system located in a location that is selected from one of inside of the aircraft and outside of the aircraft.

14. The apparatus of claim 12, wherein the information is received from a data processing system selected from one of a tablet computer, a mobile phone, a laptop computer, and a desktop computer.

15. The apparatus of claim 11, wherein the object manager is further configured to determine whether an area of interest is present from nonconformances that have been recorded.

16. The apparatus of claim 11, wherein the sections are associated with hotspots.

17. A manufacturing system comprising:
a control system configured to control manufacturing equipment configured to manufacture an aircraft; and
an object manager in the control system, wherein the object manager is configured to:
identify a model for the aircraft;
identify a location of a nonconformance in the aircraft;
display sections of the aircraft in a graphical user interface on a display device, wherein the sections correspond to sections as manufactured for assembly of the aircraft, wherein the sections are selectable, wherein graphical representations of parts are displayed in a volume in the model in the graphical user interface on the display device from a selection of a section in the sections, and wherein the volume corresponds to a location of the nonconformance in the aircraft;
identify the nonconformance for a part from a selection of a graphical representation of the part from the graphical representations of the parts, wherein the nonconformance of the part in the aircraft is identified prior to the identification of the part from the selection of the graphical representation of the part from the graphical representation of parts; and
store the nonconformance that was identified.

18. The manufacturing system of claim 17 further comprising:
the manufacturing equipment, wherein the manufacturing equipment includes at least one of fabrication equipment or assembly equipment.

* * * * *